(12) United States Patent
Dong et al.

(10) Patent No.: US 9,142,298 B2
(45) Date of Patent: Sep. 22, 2015

(54) EFFICIENT SMART VERIFY METHOD FOR PROGRAMMING 3D NON-VOLATILE MEMORY

(71) Applicant: SanDisk Technologies Inc., Plano, TX (US)

(72) Inventors: Yingda Dong, San Jose, CA (US); Cynthia Hsu, Milpitas, CA (US); Man L Mui, Santa Clara, CA (US); Manabu Sakai, Kanagawa (JP); Toru Miwa, Yokohama (JP); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 115 days.

(21) Appl. No.: 13/940,504

(22) Filed: Jul. 12, 2013

(65) Prior Publication Data

US 2014/0226406 A1    Aug. 14, 2014

Related U.S. Application Data

(60) Provisional application No. 61/763,085, filed on Feb. 11, 2013.

(51) Int. Cl.
| | | |
|---|---|---|
| *G11C 16/00* | (2006.01) | |
| *G11C 16/10* | (2006.01) | |
| *G11C 11/56* | (2006.01) | |

(Continued)

(52) U.S. Cl.
CPC ............ *G11C 16/10* (2013.01); *G11C 11/5628* (2013.01); *G11C 16/0483* (2013.01); *G11C 16/349* (2013.01); *G11C 16/3454* (2013.01); *G11C 16/3468* (2013.01)

(58) Field of Classification Search
CPC ......................................................... G11C 16/00
USPC ................................................... 365/185.01
See application file for complete search history.

(56) References Cited

U.S. PATENT DOCUMENTS

| | | |
|---|---|---|
| 6,246,610 B1 | 6/2001 | Han et al. |
| 6,269,025 B1 | 7/2001 | Hollmer et al. |
| 6,937,521 B2 | 8/2005 | Avni et al. |

(Continued)

OTHER PUBLICATIONS

International Search Report & The Written Opinion of the International Searching Authority dated Jul. 24, 2014, International Application No. PCT/US2014/015449.

(Continued)

*Primary Examiner* — Min Huang
(74) *Attorney, Agent, or Firm* — Vierra Magen Marcus LLP

(57) ABSTRACT

In a programming operation of a 3D stacked non-volatile memory device, an initial set of memory cells on a selected word line layer, involving fewer than all memory cells on a selected word line layer, are programmed first as a test case to determine optimal conditions for programming the remaining memory cells on the selected word line layer. For example, a number of program-verify iterations or loops which are needed to program the initial set of memory cells an initial amount is determined. This loop count is then stored, e.g., within the initial set of memory cells, within the remaining memory cells, within memory cells on a remaining word line layer, or in a data register, and programming of the initial set of memory cells continues to completion. Subsequently, the loop count is retrieved and used to determine an optimal starting program voltage for programming the remaining memory cells.

20 Claims, 17 Drawing Sheets

(51) Int. Cl.
*G11C 16/04* (2006.01)
*G11C 16/34* (2006.01)

(56) References Cited

U.S. PATENT DOCUMENTS

| | | | |
|---|---|---|---|
| 7,149,121 | B2 | 12/2006 | Lin et al. |
| 7,564,715 | B2 | 7/2009 | Mokhlesi |
| 7,570,520 | B2 | 8/2009 | Kamei et al. |
| 7,606,091 | B2 | 10/2009 | Li et al. |
| 7,679,961 | B2 | 3/2010 | Lee et al. |
| 7,688,632 | B2 | 3/2010 | Nagashima et al. |
| 7,907,463 | B2 | 3/2011 | Edahiro et al. |
| 7,916,543 | B2 | 3/2011 | Goda et al. |
| 8,018,769 | B2 | 9/2011 | Tu et al. |
| 8,036,044 | B2 | 10/2011 | Dong et al. |
| 8,149,625 | B2 | 4/2012 | Hwang |
| 8,264,885 | B2 | 9/2012 | Goda et al. |
| 8,320,185 | B2 | 11/2012 | Marquart |
| 2008/0062768 | A1* | 3/2008 | Li et al. .................... 365/185.19 |
| 2011/0002172 | A1 | 1/2011 | Kito et al. |
| 2011/0031952 | A1 | 2/2011 | Nakamura |
| 2011/0164454 | A1 | 7/2011 | Hwang |
| 2011/0249498 | A1 | 10/2011 | Tokiwa et al. |
| 2012/0218818 | A1 | 8/2012 | Han et al. |
| 2012/0241841 | A1 | 9/2012 | Mizushima et al. |
| 2012/0287710 | A1 | 11/2012 | Shirakawa |
| 2012/0299189 | A1 | 11/2012 | Nakajima |
| 2013/0235667 | A1* | 9/2013 | NAM et al. ............... 365/185.17 |
| 2014/0293698 | A1* | 10/2014 | Beltrami et al. ......... 365/185.12 |

OTHER PUBLICATIONS

U.S. Appl. No. 14/278,374, filed May 15, 2014.
Non-final Office Action dated Aug. 7, 2014, U.S. Appl. No. 14/278,374, filed May 15, 2014.
Response to Office Action dated Nov. 5, 2014, U.S. Appl. No. 14/278,374, filed May 15, 2014.
Final Office Action dated Jan. 2, 2015, U.S. Appl. No. 14/278,374, filed May 15, 2014.
Response to Office Action dated Mar. 9, 2015, U.S. Appl. No. 14/278,374, filed May 15, 2014.

* cited by examiner

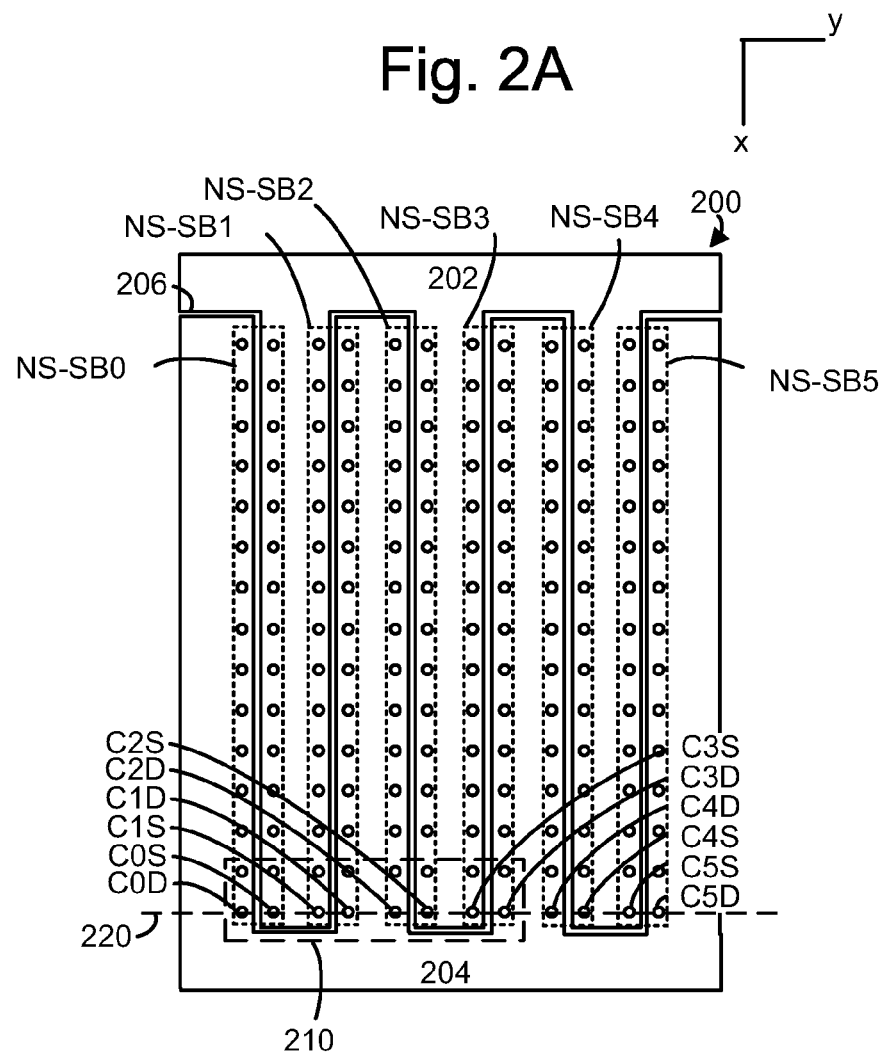

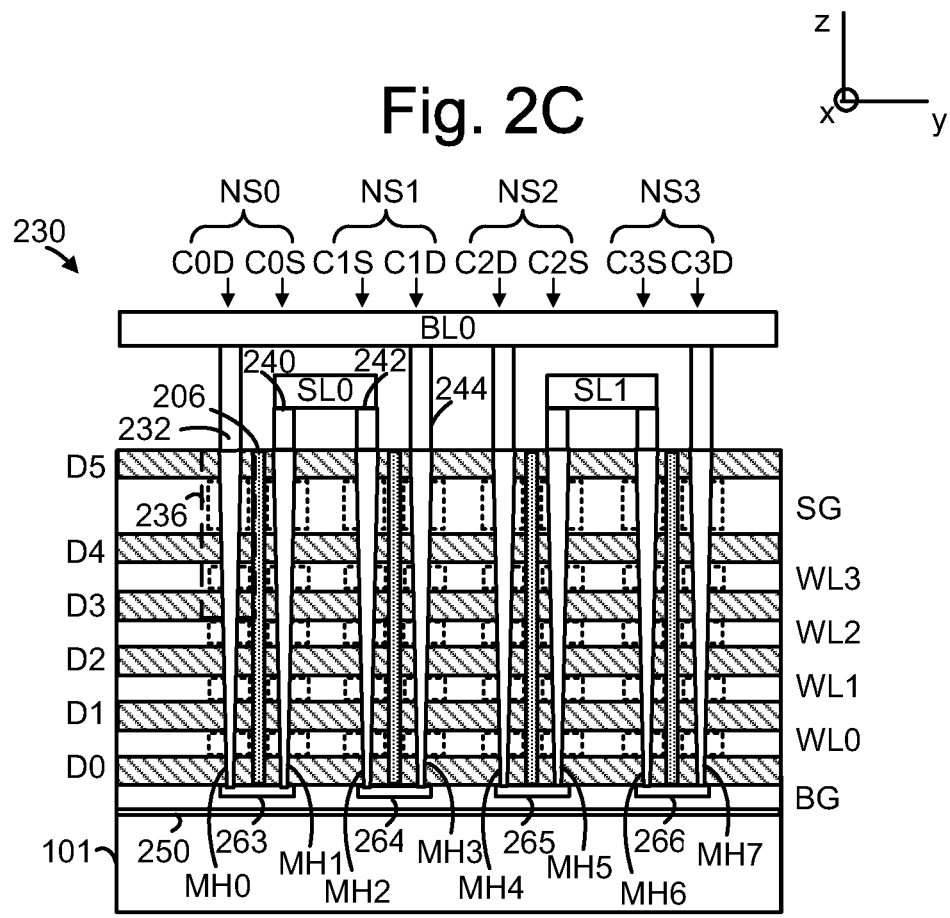

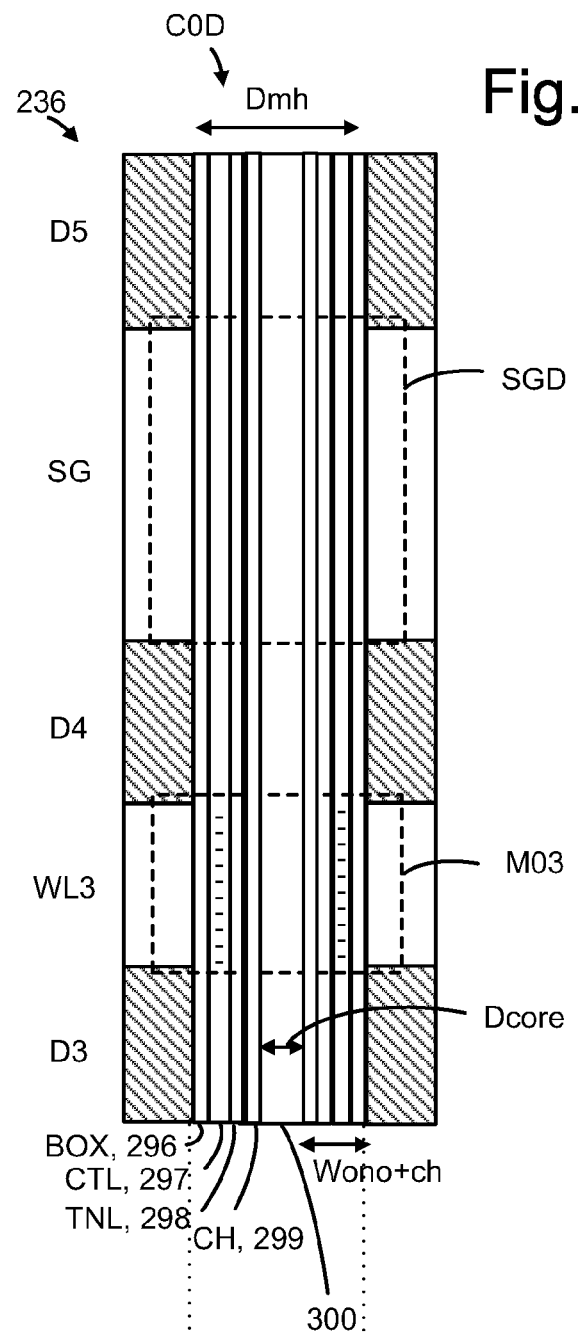
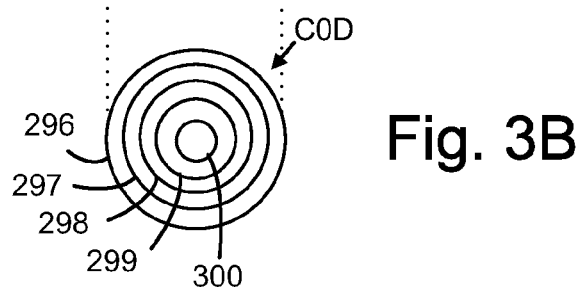
Fig. 3A
Fig. 3B

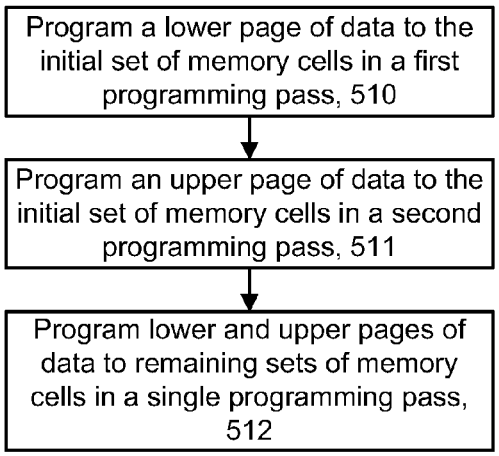
Fig. 5A   Fig. 5B
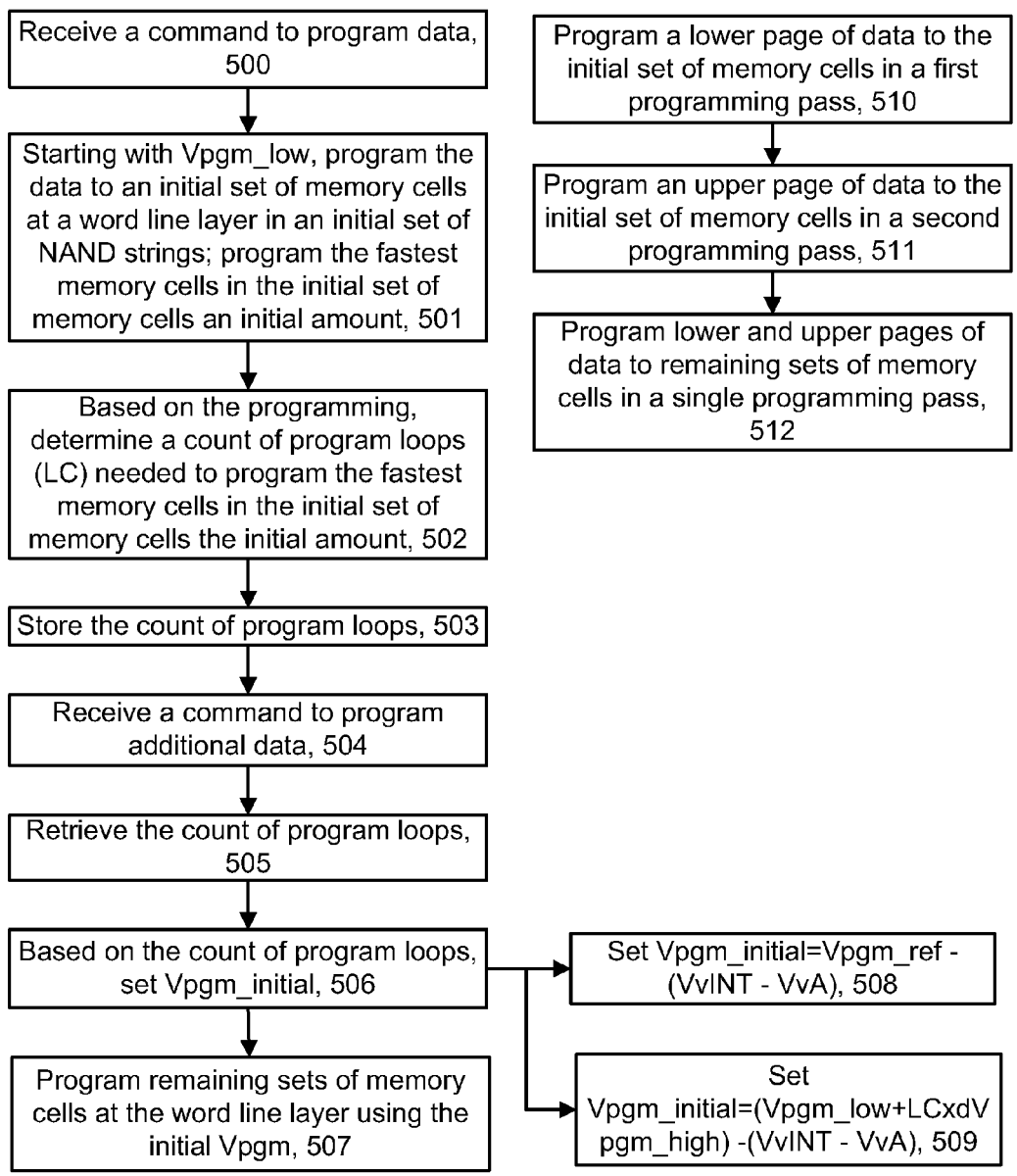

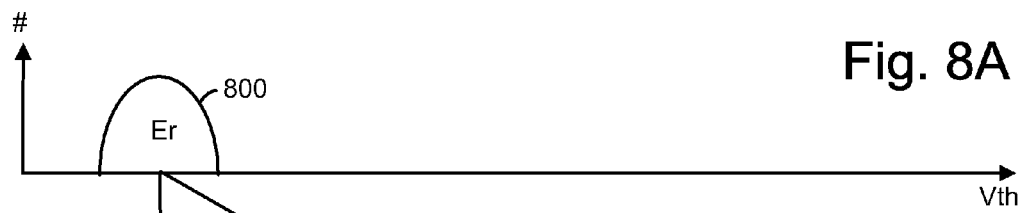
Fig. 8A
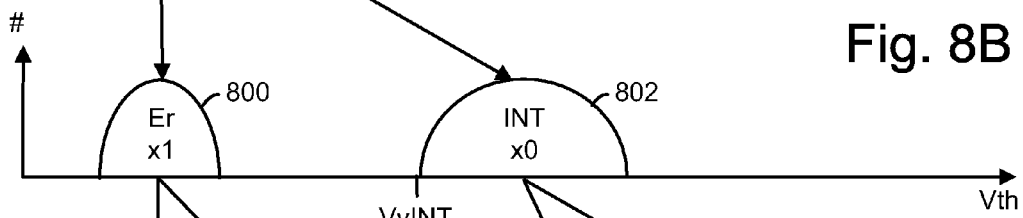
Fig. 8B
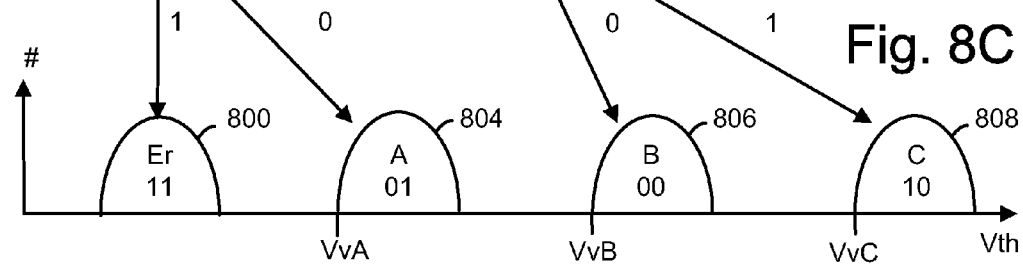
Fig. 8C
Fig. 8D
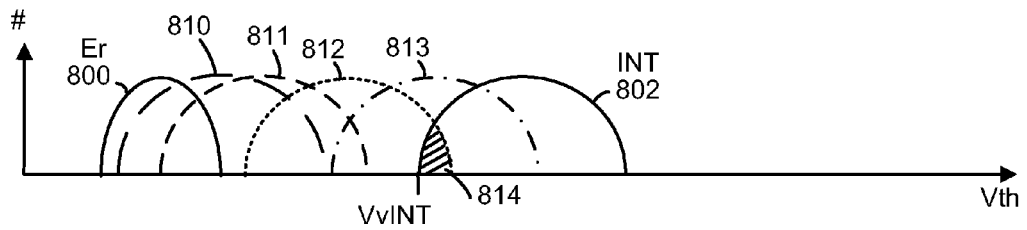

EFFICIENT SMART VERIFY METHOD FOR PROGRAMMING 3D NON-VOLATILE MEMORY

CROSS-REFERENCE TO RELATED APPLICATIONS

This application claims the benefit of U.S. provisional patent application No. 61/763,085, filed Feb. 11, 2013, and incorporated herein by reference.

BACKGROUND OF THE INVENTION

1. Field of the Invention

The present invention relates to techniques for programming memory cells in a 3D-non-volatile memory device.

2. Description of the Related Art

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

BRIEF DESCRIPTION OF THE DRAWINGS

Like-numbered elements refer to common components in the different figures.

FIG. 2A depicts a top view of a U-shaped NAND embodiment of a block 200, showing example NAND string sub-blocks NS-SB0 to NS-SB5, as an example implementation of BLK0 in FIG. 1A.

FIG. 2C depicts a cross-sectional view of the portion 210 of the block 200 of FIG. 2A, along line 220.

FIG. 3A depicts a close-up view of the region 236 of the column C0D of FIG. 2C, showing a drain-side select gate SGD and a memory cell M03.

FIG. 3B depicts a cross-sectional view of the column C0D of FIG. 3A.

FIG. 5A depicts a flowchart of an example programming operation in which an initial Vpgm is optimized.

FIG. 5B depicts an example process for carrying out the programming operation of FIG. 5A when programming lower and upper pages of data.

FIGS. 8A to 8C depict a two-pass programming operation, in which four data states are used.

FIG. 8D depicts a process for determining a count of program loops needed to program the fastest memory cells in an initial set of memory cells an initial amount, in accordance with step 502 of FIG. 5A and with the transition from FIG. 8A to 8B.

DETAILED DESCRIPTION

Figure 1A:
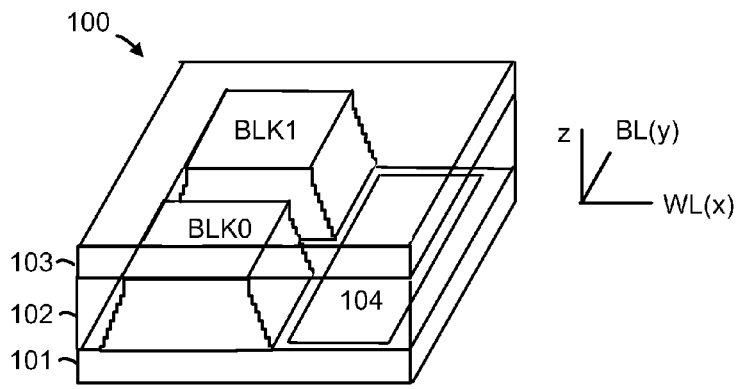
FIG. 1A is a perspective view of a 3D stacked non-volatile memory device.

A technique is provided for setting an optimal initial program voltage in a 3D stacked non-volatile memory device.

A 3D stacked non-volatile memory device includes a stack of alternating conductive and insulating layers in which memory cells are formed. The conductive layers form word lines which are connected to control gates of the memory cells. A block of such a memory device is typically divided into multiple sub-blocks for erase and programming operations, where all the sub-blocks share same word line (WL), bit line (BL) and source line (SL) biases, but have separate select gate (SGS and SGD) biases. For this reason, the block size in BiCS technology is large (e.g., 16 MB).

The memory cells are arranged along memory holes which extend vertically through the stack. However, due to the high aspect ratio of the memory holes, it is difficult to etch the memory holes with a uniform diameter. Typically, the memory holes are narrower at the bottom of the stack than at the top. As a result, the memory holes at the bottom of the stack can have a higher programming speed, and programming speed can vary for different word lines. This make it difficult to trim the initial program voltage, Vpgm_initial. Moreover, the variations in programming speed can become greater as the memory device accumulates program-erase cycles. These increases can be greater in 3D memory than in 2D memory. Another factor is that the variations in the memory hole diameter can be different for different blocks across the die.

One solution is to set Vpgm_initial to a common level for a group of adjacent word lines. The level of Vpgm_initial for a group is then based on the position of the group along the memory holes. However, this may not adequately account for word line-to-word line variations in programming speed. Another solution is to set Vpgm_initial to a common level for a group of NAND strings in a region of a block. The level of Vpgm_initial for a group is then based on the position of the group in a block. However, this does not account for word line-to-word line variations in programming speed. Another solution is to optimize Vpgm_initial for each set of memory cells. However, memory cells in different groups but at the same word line layer typically have a common memory hole diameter so that providing groups in this manner is inefficient.

Techniques provided herein determine an optimal Vpgm_initial for a word line layer based on programming of an initial set (a test set) of memory cells of the one word line layer. This optimal Vpgm_initial can then be used for programming other remaining sets of memory cells at the same word line layer. The process can be repeated so that an optimal Vpgm_initial is determined and used for each word line layer. In one approach, the optimal Vpgm_initial is determined in a smart verify process in which a number of program loops (program pulses) which are needed to program the memory cells of the test set a certain amount is counted and recorded. The optimal Vpgm_initial for programming the remaining memory cells of the word line layer is derived from the count of program loops. Moreover, the test set of memory cells can be used to store user data or other data just as the remaining sets of memory cells are used.

Moreover, the programming of the test set of memory cells can be different than the programming of the remaining sets of memory cells. For example, the count of program loops can be determined while programming a lower page of data in the test set of memory cells in a first programming pass of a multi-pass programming operation. Each remaining set of memory cells can be programmed in a respective one-pass programming operation. Thus, additional time is taken to program the test set of memory cells, but this is an acceptable tradeoff for obtaining an optimal Vpgm_initial which can be used in programming several remaining sets of memory cells. The count of program loops can be stored in the test set of memory cells, in other memory cells on the die, or outside the die such as in a data register. The count can be retrieved and used to determine the optimal Vpgm_initial by a remaining set of memory cells at a time in which the remaining set of memory cells is used to store data. This can be immediately after the test set of memory cells is used to store data, or some time later.

The technique automatically compensates for increasing program-erase cycles, block-to-block variations and word line-to-word line variations. Further, by optimizing the programming, tighter Vth distributions can be achieved.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
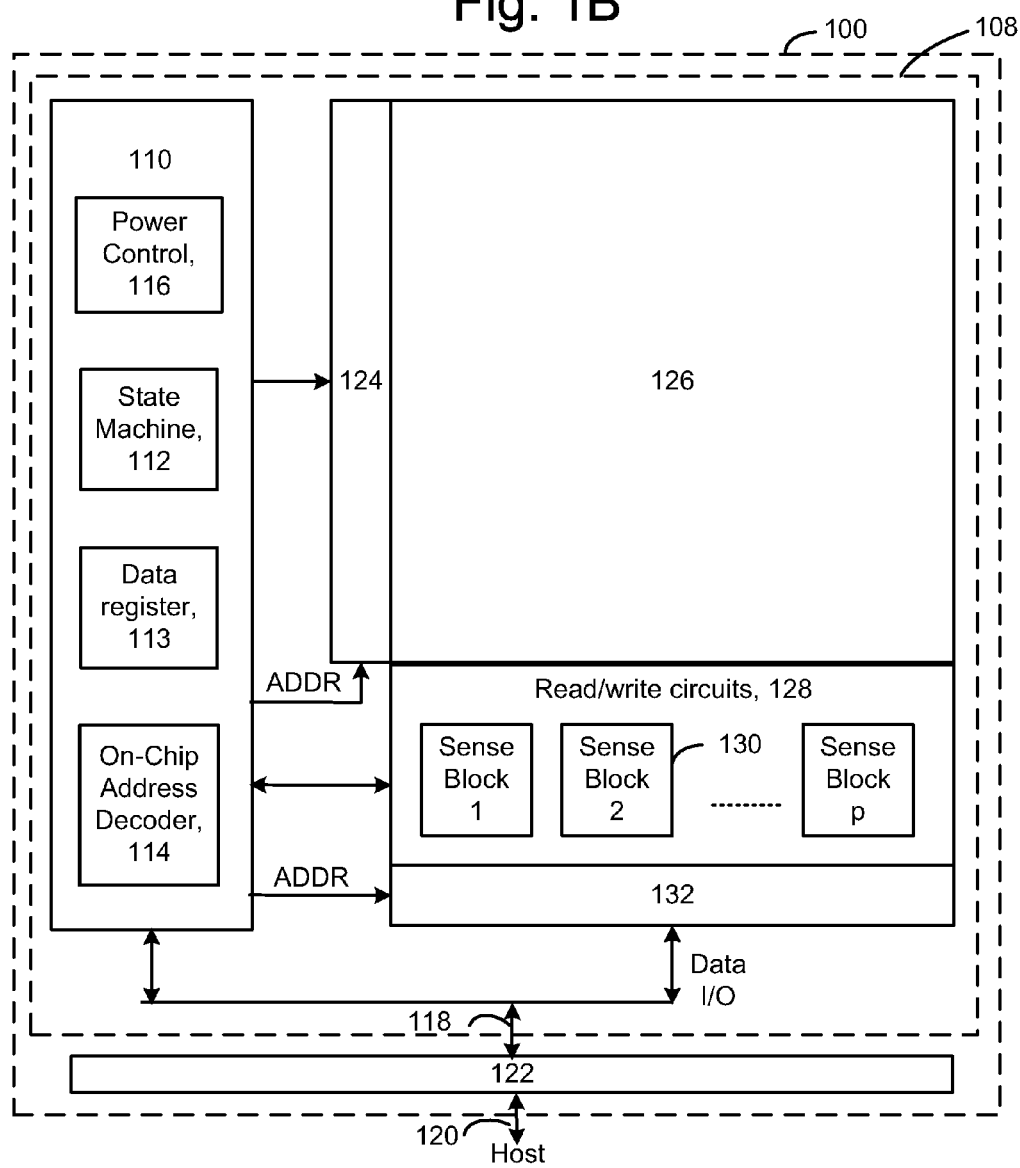
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array of memory cells 126, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, a data register 113, an on-chip address decoder 114, and a power control module 116. The state machine 112 provides chip-level control of memory operations. The data register may be used for storing a count of program loops for use in optimizing Vpgm_initial, as mentioned at the outset. The data register could also store Vpgm_initial. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 130 can include bit line drivers, in one approach.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control 116, sense blocks 130, read/write circuits 128, and controller 122, and so forth.

In another embodiment, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 126. In this way, the density of the read/write modules is reduced by one half.

Other types of non-volatile memory in addition to NAND flash memory can also be used.

FIG. 2A depicts a top view of a U-shaped NAND embodiment of a block 200, showing example NAND string subblocks NS-SB0 to NS-SB5, as an example implementation of BLK0 in FIG. 1A. The view is of a representative layer among the multiple word line layers in a stack. Referring also to FIG. 2C, the stack includes alternating dielectric and conductive layers. The dielectric layers include D0 to D5 and may be made of SiO2, for instance. The conductive layers include BG, which is a back gate layer, WL0 to WL3, which form word line layers, e.g., conductive paths to control gates of the memory cells at the layer, and SG, which forms a select gate layer, e.g., a conductive path to control gates of select gate transistors of NAND strings. The word line layer of FIG. 2A may represent any one of WL0 to WL3, for instance. The conductive layers may include doped polysilicon or metal silicide, for instance. An example voltage of 5-10 V may be applied to the back gate to maintain a conductive state which connects the drain- and source-side columns.

For each block, the word line layer is divided into two portions (or planes) 202 and 204. Each word line layer or portion can be considered to be simply a word line, and is connected to the control gates of associated memory cells. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the two word line layer portions can be driven independently at each layer or height in the stack.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0D to C5D (D denotes a drain side column and S denotes a source side column). The figure represents a simplification, as many more rows of memory holes will typically be used, extending to the right and left in the figure. Also, the figures are not necessarily to scale. The columns of memory cells can be arranged in subsets such as sub-blocks.

Each memory cell can belong to a WL subset, a NAND string sub-block and a BL subset.

A portion 210 of the block 200 is described further below in connection with FIG. 3A.

Figure 2B:
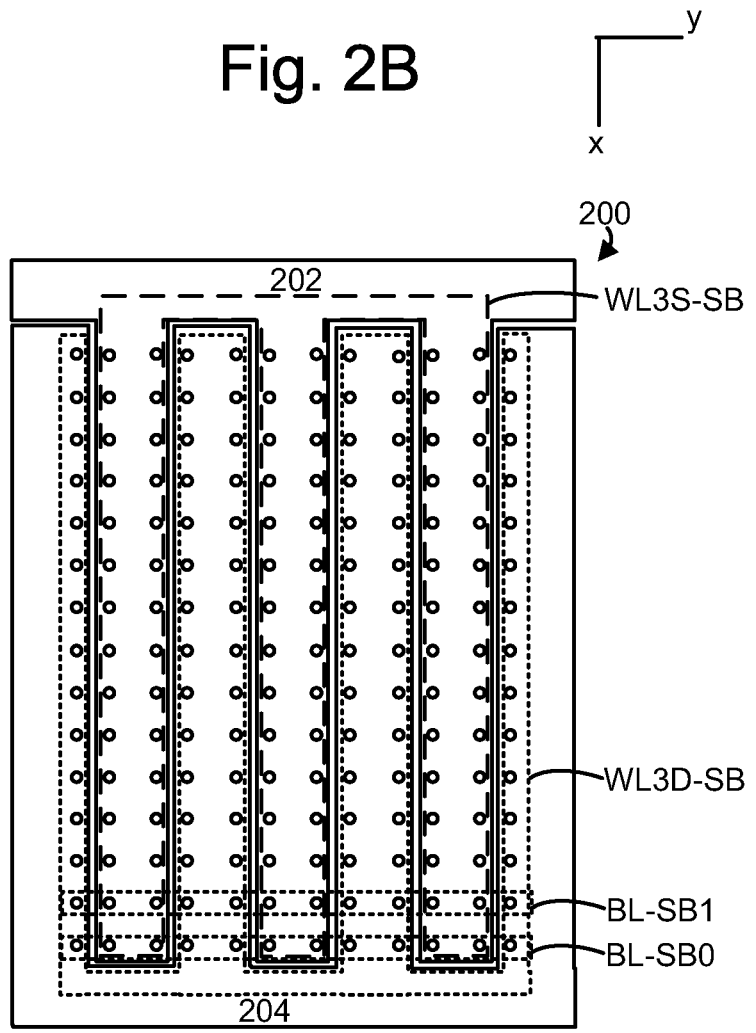
FIG. 2B depicts the block 200 FIG. 2A, showing example word line subsets WL3D-SB and WL3S-SB and example bit line subsets BL-SB0 and BL-SB1.

FIG. 2B depicts the block 200 FIG. 2A, showing example word line subsets WL3D-SB and WL3S-SB and example bit line subsets BL-SB0 and BL-SB1. This example assumes that the WL3 layer is depicted. WL3S-SB is a portion of a word line layer connected to one memory cell in the source-side of each U-shaped NAND string, and WL3D-SB is a portion of a word line layer connected to one memory cell in the drain-side of each U-shaped NAND string.

When U-shaped NAND strings are used, each NAND string sub-block can include two adjacent rows of columns of memory cells. In the sub-block, the adjacent rows are separated by the slit. The columns of memory cells on one side of the slit are drain-side columns (e.g., C0D, C1D, C2D and C3D in FIG. 2C) of NAND strings, and the columns of memory cells on the other side of the slit are source-side columns (e.g., C0S, C1S, C2S and C3S in FIG. 2C) of the NAND strings. Note that the pattern of two source-side columns between two drain-side columns repeats in the y-direction.

Word line drivers can independently provide signals such as voltage waveforms to the word line layer portions at each word line level of the memory device. Word line layer portions 202 and 204 are examples at the WL3 level.

The drawings are not to scale and do not show all memory columns. For example, a more realistic block might have twelve memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assuming four memory cells per column, as a simple example, there are 384 k×4=1,536 k or 1,536,000 total cells in the set.

FIG. 2C depicts a cross-sectional view of the portion 210 of the block 200 of FIG. 2A, along line 220. Columns of memory cells are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0D and C0S and connecting portion 263 and has a drain end 232 and a source end 240. NS1 includes columns C1S and C1D and connecting portion 264 and has a drain end 244 and a source end 242. NS2 includes columns C2D and C2S and connecting portion 265. NS3 includes columns C3S and C3D and connecting portion 266.

The source line SL0 is connected to the source ends 240 and 242 of two adjacent memory strings NS0 and NS1. The source line SL0 is also connected to other sets of memory strings which are behind NS0 and NS1 in the x direction. Recall that additional U-shaped NAND strings in the stack 230 extend behind the U-shaped NAND strings depicted in the cross-section, e.g., along the x-axis, in a SGD line direction. The U-shaped NAND strings NS0 to NS3 are each in a different NAND string sub-block, but are in a common BL subset.

The slit portion 206 from FIG. 2A is also depicted as an example. In the cross-section, multiple slit portions are seen, where each slit portion is between the drain- and source-side columns of a U-shaped NAND string. A portion of the bit line BL0 is also depicted.

Short dashed lines depict memory cells and select gate transistors, as discussed further below. A region 236 of the stack is shown in greater detail in FIG. 3A.

Memory holes MH0-MH7 are depicted extending vertically in the stack. These are respective memory holes for the memory cells. For example, MH0 is a respective memory hole for M00, M01, M02, M03, M10, M11, M12 and M13 in NS0 (see FIG. 3C). Columns C0D, C0S, C1S, C1D, C2D, C2S, C3S and C3D are provided in MH0-MH7, respectively. Each memory hole is shown having a tapered shape which is wider at the top of the stack and narrower at the bottom of the stack. However, this tapered profiled is not required. The memory hole diameters can vary in any way. The memory holes could be wider partway between the top and bottom. See FIG. 3D, which shows a cross-sectional width of a memory hole which is uniformly tapered from top to bottom. FIG. 3E shows a cross-sectional width of a memory hole which flares out to a widest region near the top and is then tapered toward the bottom. An assumption is that the memory hole diameters vary in a similar way so that the diameter is similar within a word line layer, but different in different word line layers. The memory hole diameter is a function of the z coordinate (elevation or height) in the stack.

FIG. 3A depicts a close-up view of the region 236 of the column C0D of FIG. 2C, showing a drain-side select gate transistor SGD and a memory cell (memory cell) M03. The region also shows portions of the dielectric layers D3, D4 and D5. Each column includes a number of layers which are deposited along the sidewalls of the column. These layers can include oxide-nitride-oxide (O—N—O) and polysilicon layers which are deposited, e.g., using atomic layer deposition. For example, a block oxide (BOX) can be deposited as layer 296, a nitride such as SiN as a charge trapping layer (CTL) can be deposited as layer 297 and a tunnel oxide (TNL) can be deposited as layer 298, to provide the O—N—O layers. Further, a polysilicon body or channel (CH) can be deposited as layer 299, and a core filler dielectric can be deposited as region 300. Additional memory cells are similarly formed throughout the columns. Dmh represents the memory hole diameter, and Dcore represents the core diameter, which can both vary along the length or longitudinal axis of the memory hole, as discussed. Wono+ch is a width of the O—N—O and CH layers combined.

When a memory cell is programmed, electrons are stored in a portion of the CTL which is associated with the memory cell. For example, electrons are represented by "−" symbols in the CTL 297 for the MC. These electrons are drawn into the CTL from the channel, and through the TNL. The Vth of a memory cell is increased in proportion to the amount of stored charge.

Each of the memory holes is filled with a plurality of annular layers comprising a block oxide layer, a charge trapping layer, a tunneling layer and a channel layer. A core region of each of the memory holes is filled with a body material, and the plurality of annular layers are between the core region and the word line layers in each of the memory holes. Further, the diameter of the memory hole (Dmh) varies along a memory hole based on a variation in the diameter of the core region (Dcore) based on the assumption that Wono+ch is fixed, where Dcore+Wono+ch=Dmh. See also FIG. 10A.

FIG. 3B depicts a cross-sectional view of the column C0 of FIG. 3A. Each layer is ring-shaped in one possible approach, except the core filler, which is a tapered cylinder.

Figure 3C:
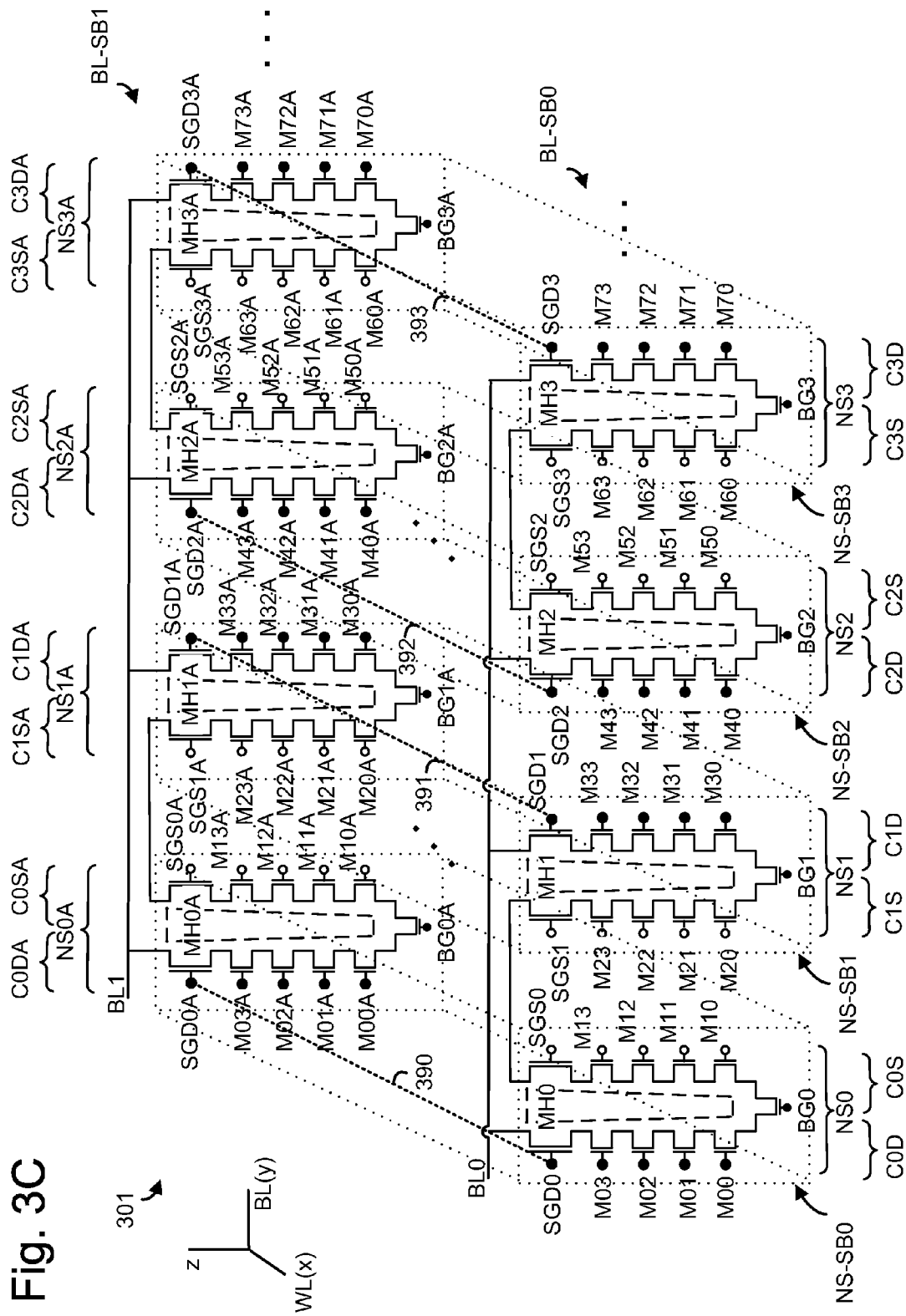
FIG. 3C depicts one embodiment of a circuit 301 for the NAND string sub-blocks NS-SB0 to NS-SB3 of FIG. 2A.
Figures 3D, 3E:
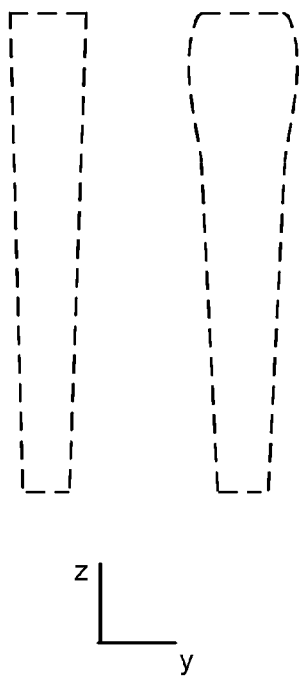
FIG. 3D shows a cross-sectional width of a memory hole which is uniformly tapered from top to bottom.
FIG. 3E shows a cross-sectional width of a memory hole which flares out to a widest region near the top and is then tapered toward the bottom.

FIG. 3C depicts one embodiment of a circuit 301 for the NAND string sub-blocks NS-SB0 to NS-SB3 of FIG. 2A. NS-SB0 includes NS0, . . . , NS0A, NS-SB1 includes NS1, . . . , NS1A, NS-SB2 includes NS2, . . . , NS2A and NS-SB3 includes NS3, . . . , NS3A. Each NAND string has memory cells along a respective memory hole. For example, NS-SB0 includes memory holes MH0, . . . , MH0A, NS-SB1 includes memory holes MH1, . . . , MH1A, NS-SB2 includes memory holes MH2, . . . , MH2A and NS-SB3 includes memory holes MH3, . . . , MH3A.

NAND strings NS0, NS1, NS2 and NS3 are in communication with a bit line BL0 (a first bit line) in BL-SB0 (a first bit line sub-block), and NAND strings NS0A, NS1A, NS2A and NS3A are in communication with a bit line BL1 (a second bit line) in BL-SB1 (a second bit line sub-block). In this example, each NAND string has a drain-side column with four memory cells and a SGD transistor, and a source-side column with four memory cells and a SGS transistor. The filled in circles indicate control gates of the select transistor and the memory cells on the drain side of a NAND string. The open circles indicate control gates of the select transistor and the memory cells on the source side of a NAND string.

For example, NS0 has a drain side column C0D comprising memory cells M00, M01, M02 and M03 and an SGD transistor SGD0, and a source side column C0S comprising memory cells M10, M11, M12 and M13 and an SGS transistor SGS0. NS1 has a drain side column CM comprising memory cells M30, M31, M32 and M33 and an SGD transistor SGD1, and a source side column C1S comprising memory cells M20, M21, M22 and M23 and an SGS transistor SGS1. NS2 has a drain side column C2D comprising memory cells M40, M41, M42 and M43 and an SGD transistor SGD2, and a source side column C2S comprising memory cells M50, M51, M52 and M53 and an SGS transistor SGS2. NS3 has a drain side column C3D comprising memory cells M70, M71, M72 and M73 and an SGD transistor SGD3, and a source side column C3S comprising memory cells M60, M61, M62 and M63 and an SGS transistor SGS3.

Similarly, NS0A has a drain side column C0DA comprising memory cells M00A, M01A, M02A and M03A and an SGD transistor SGD0A, and a source side column C0SA comprising memory cells M10A, M11A, M12A and M13A and an SGS transistor SGS0A. NS1A has a drain side column C1DA comprising memory cells M30A, M31A, M32A and M33A and an SGD transistor SGD1A, and a source side column C1SA comprising memory cells M20A, M21A, M22A and M23A and an SGS transistor SGS1A. NS2A has a drain side column C2DA comprising memory cells M40A, M41A, M42A and M43A and an SGD transistor SGD2A, and a source side column C2SA comprising memory cells M50A, M51A, M52A and M53A and an SGS transistor SGS2A. NS3A has a drain side column C3D comprising memory cells M70A, M71A, M72A and M73A and an SGD transistor SGD3A, and a source side column C3SA comprising memory cells M60A, M61A, M62A and M63A and an SGS transistor SGS3A.

Each NAND string has a back gate (BG0 for NS0, BG1 for NS1, BG2 for NS2, BG3 for NS3, BG0A for NS0A, BG1A for NS1A, BG2A for NS2A, BG3A for NS3A). The control gates of all of the back gates in the circuit may be connected to one another.

In one approach, the source side of each SGS transistor is connected to a common source line of the circuit.

At each level of the circuit, the control gates of the drain-side memory cells are connected to one another by a common word line layer. For example, M03, M03A, M33, M33A, M43, M43A, M73 and M73A have control gates connected by a word line layer WL3D, consistent with FIG. 2B. M13, M13A, M23, M23A, M53, M53A, M63 and M63A have control gates connected by a word line layer WL3S, consistent with FIG. 2B.

M02, M02A, M32, M32A, M42, M42A, M72 and M72A have control gates connected by a word line layer WL2D. M12, M12A, M22, M22A, M52, M52A, M62 and M62A have control gates connected by a word line layer WL2S.

M01, M01A, M31, M31A, M41, M41A, M71 and M71A have control gates connected by a word line layer WL1D. M11, M11A, M21, M21A, M51, M51A, M61 and M61A have control gates connected by a word line layer WL1S.

M00, M00A, M30, M30A, M40, M40A, M70 and M70A have control gates connected by a word line layer WL0D. M10, M10A, M20, M20A, M50, M50A, M60 and M60A have control gates connected by a word line layer WL0S.

Additionally, control gates of the SGD transistors are connected to one another in respective NAND string sub-blocks. For example, in NS-SB0, control gates of SGD0, . . . , SGD0A are connected by path 390. In NS-SB1, control gates of SGD1, . . . , SGD1A are connected by path 391. In NS-SB3, control gates of SGD2, . . . , SGD2A are connected by path 392. In NS-SB3, control gates of SGD3, . . . , SGD3A are connected by path 393.

The control gates of the SGS transistors are connected to one another in the x-direction. For example, control gates of SGS0, . . . , SGS0A are connected, control gates of SGS1, . . . , SGS1A are connected, control gates of SGS2, . . . , SGS2A are connected, and control gates of SGS3, . . . , SGS3A are connected.

In an example programming technique discussed further below, the memory cells in one of the NAND string sub-blocks are used to determine an optimal Vpgm_initial for the remaining sub-blocks, for each word line layer. For example, at the top word line layer (WL3), in NS-SB0, an initial set of memory cells which is programmed can include memory cells M03, . . . , M03A and M13, . . . , M13A. This initial set of memory cells is programmed to determine a value of Vpgm_initial which is used in programming remaining sets of memory cells on WL3. This value of Vpgm_initial may be represented by Vpgm_initial(WLi), where WLi is the ith word line layer. For WL3, Vpgm_initial(WLi)=Vpgm_initial (WL3).

NS-SB1 may be programmed next. In NS-SB1, a remaining set of memory cells which is programmed using Vpgm_initial(WL3) can include memory cells M23, . . . , M23A and M33, . . . , M33A in NS-SB1. NS-SB2 may be programmed next. In NS-SB2, another remaining set of memory cells which is programmed using Vpgm_initial(WL3) can include memory cells M43, . . . , M43A and M53, . . . , M53A in NS-SB2. NS-SB3 may be programmed next. In NS-SB3, an additional remaining set of memory cells which is programmed using Vpgm_initial(WL3) can include memory cells M63, . . . , M63A and M73, . . . , M73A in NS-SB3, and so forth. In this example, both the source and drain side memory cells of the NAND strings in a NAND string sub-block at a selected word line layer are programmed concurrently. Subsequently, the source and drain side memory cells of the NAND strings in a next NAND string sub-block at the selected word line layer are programmed concurrently. This continues until programming of WL3 is complete. Subsequently, both the source and drain side memory cells of the NAND strings in a NAND string sub-block at a next word line layer (e.g., WL2) are programmed concurrently, and so forth.

In another approach, the source side memory cells are programmed in each NAND sub-block at the selected word line layer, then the drain side memory cells are programmed in each NAND sub-block at the selected word line layer, then a next word line layer is programmed similarly. In another approach, the drain side memory cells are programmed in each NAND sub-block at the selected word line layer, then the source side memory cells are programmed in each NAND sub-block at the selected word line layer, then a next word line layer is programmed similarly. In another approach, the source side memory cells are programmed in each NAND sub-block at the selected word line layer, then the drain side memory cells are programmed in each NAND sub-block at the selected word line layer, then a next word line layer is programmed similarly.

These examples program adjacent word line layers, one after another. It is also possible to program one word line layer, then skip an adjacent word line layer and program a non-adjacent word line layer.

Typically, during programming of memory cells in a selected NAND string sub-block, the SGD transistors are provided in a conductive state and the respective bit lines are set at 0 V to allow programming to occur. At the same time, a program voltage is applied to a selected word line layer or word line layer portion, and pass voltages are applied to unselected word line layers or word line layer portions. For the unselected NAND string sub-blocks, the SGD transistors are provided in a non-conductive state and the respective bit lines are set at a high level to float the respective channel regions and thereby prevent programming.

Figure 4A:
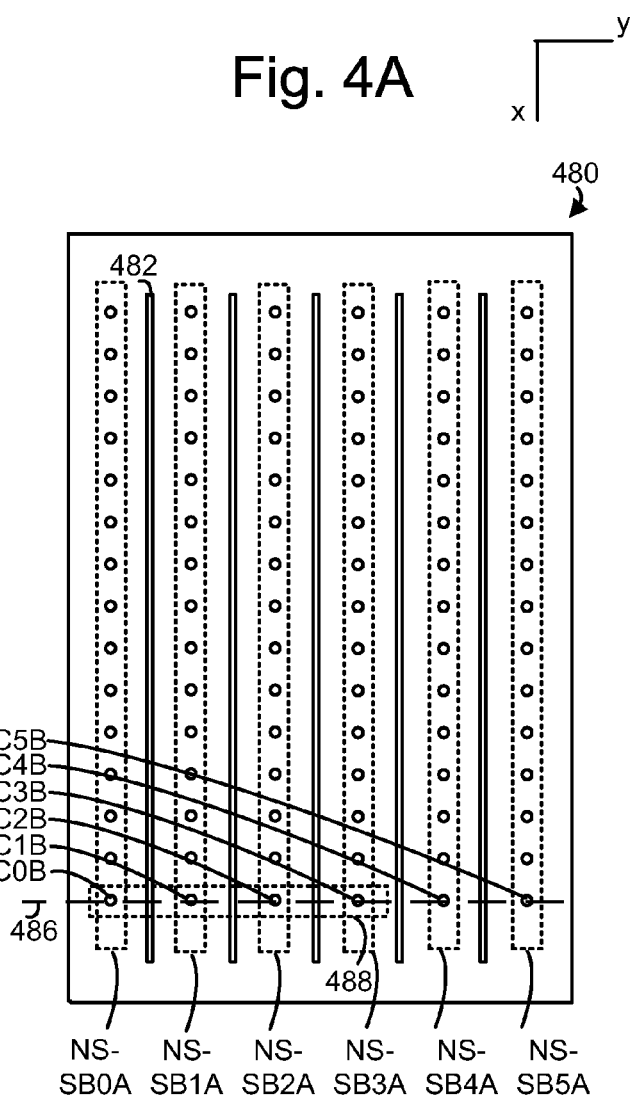
FIG. 4A depicts a top view of a straight NAND string embodiment 480 of the block BLK0 of FIG. 1A, showing example NAND string sub-blocks NS-SB0A to NS-SB5A.

FIG. 4A depicts a top view of a straight NAND string embodiment 480 of the block BLK0 of FIG. 1A, showing example NAND string sub-blocks NS-SB0A to NS-SB5A. In this configuration, a NAND string has only one column, and the source-side select gate is on the bottom of the column instead of on the top, as in a U-shaped NAND string. A given word line layer is connected to one of the memory cells of each NAND string.

A number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C0B, C1B, C2B, C3B, C4B and C5B. Each column represents a NAND string or memory hole. A cross-sectional view along line 486 of portion 488 is shown in FIG. 4C.

Figure 4B:
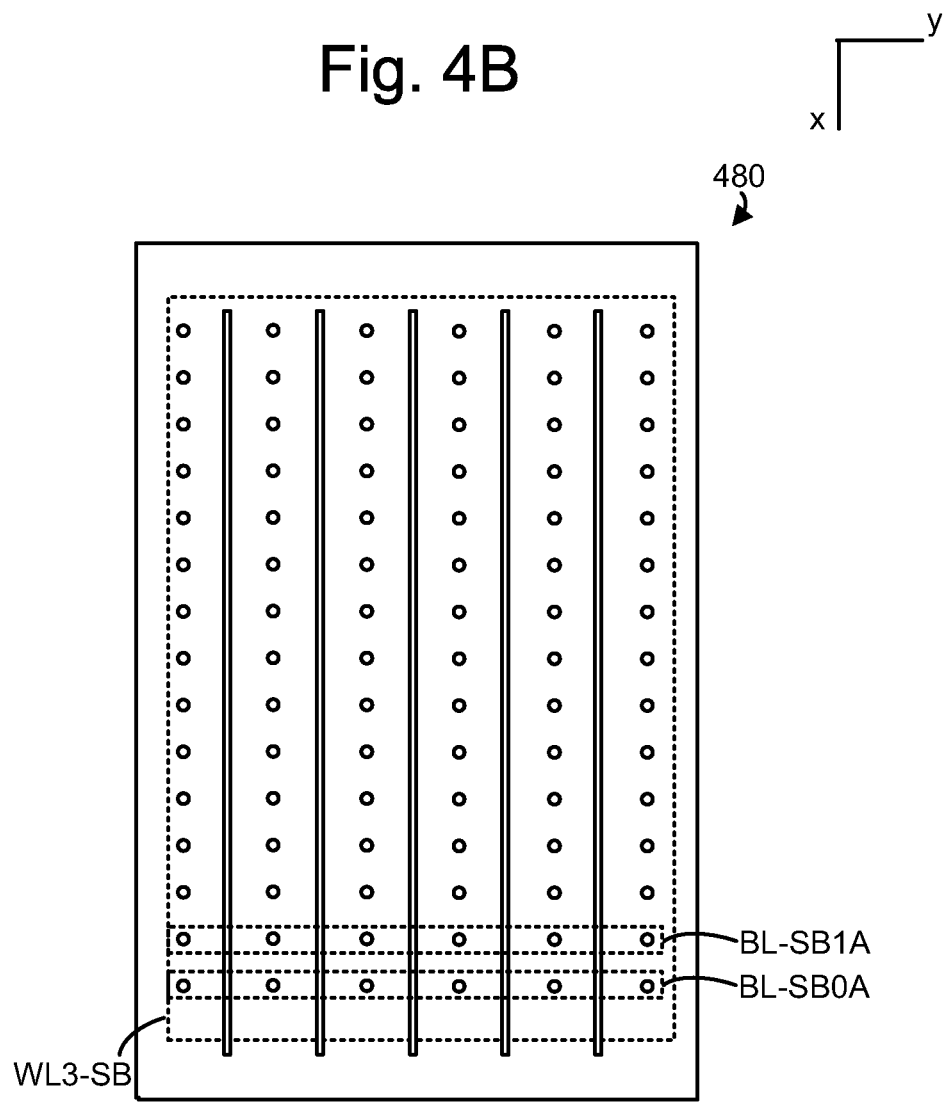
FIG. 4B depicts the block BLK0 of FIG. 4A, showing an example WL subset WL3-SB and example bit line subsets BL-SB0A and BL-SB1A.

FIG. 4B depicts the block BLK0 of FIG. 4A, showing an example WL subset WL3-SB and example bit line subsets BL-SB0A and BL-SB1A.

Figure 4C:
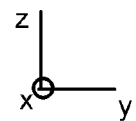
FIG. 4C depicts a cross-sectional view of the portion 488 of the block 480 of FIG. 4A along line 486.
Figure 4C:
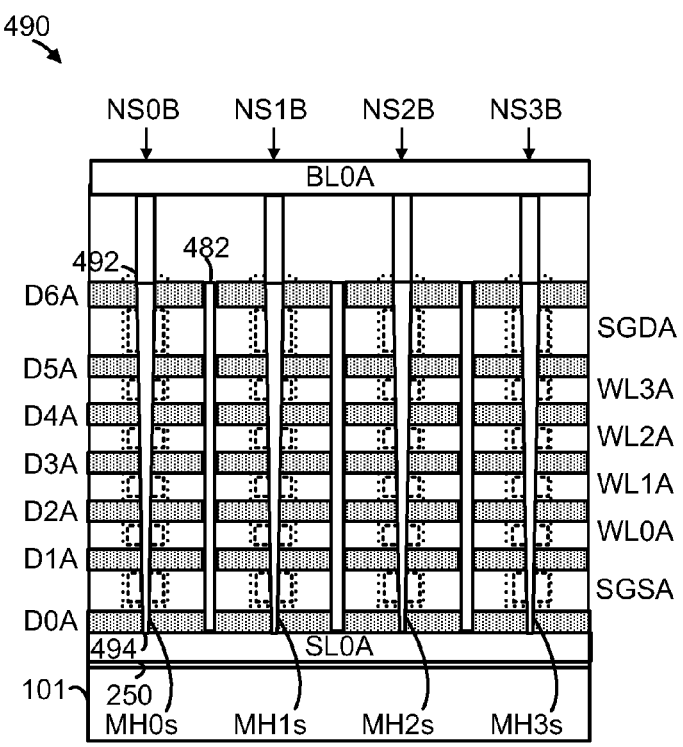

FIG. 4C depicts a cross-sectional view of the portion 488 of the block 480 of FIG. 4A along line 486. Columns of memory cells corresponding to NAND strings NS0B, NS1B, NS2B and NS3B are depicted in the multi-layer stack. The stack 490 includes a substrate 101, an insulating film 250 on the substrate, and a portion of a source line SL0A. Recall that the additional straight NAND strings in a NAND string sub-block extend in back of the NAND strings depicted in the cross-section, e.g., along the x-axis. NS0B has a source end 494 and a drain end 492. The slit 482 from FIG. 4A is also depicted with other slits. A portion of a bit line BL0A is also depicted. Dashed lines depict memory cells and select gate transistors. The programming techniques described herein can be used with a U-shaped or straight NAND strings. Memory holes MH0s, MH1s, MH2s and MH3s are associated with NAND strings NS0B, NS1B, NS2B and NS3B. Word line layers are WL0A, WL1A, WL2A and WL3A. Dielectric layers are D0A, D1A, D2A, D3A, D4A, D5A and D6A. SGSA is a source-side select gate layer.

FIG. 5A depicts a flowchart of an example programming operation in which an initial Vpgm is optimized. At step 500, a command to program data is received. For example, a host device may issue a command which is received by the control circuitry 110. Typically, a write command includes a unit of data such as a page data which is to be written (programmed). Step 501 programs the data to an initial set of memory cells at a word line layer in an initial set of NAND strings, such as a sub-block of NAND strings. This includes programming the fastest memory cells in the initial set of memory cells an initial amount. The programming starts with a program voltage of Vpgm_low.

At step 502, based on the programming of step 501, a count of program loops which are needed to program the fastest memory cells in the initial set of memory cells the initial amount is determined. Step 503 stores the count of program loops (LC). This is a minimum number of program loops needed to program the initial set of memory cells an initial amount. For example, the count can be stored in a byte of data in spare memory cells of the initial set of memory cells. In a redundant storage approach, the byte can include a first set of four bits which represent LC and a second set of four bits, each of which is an inverse of the corresponding bit in the first set. This byte of data can be in a predetermined location of the initial set of memory cells so that the data can be read when programming a remaining set of memory cells.

As an example, in FIG. 3C, in the set of memory cells at WL3 in NS-SB0, the subset of memory cells can include M03 and M13. In the set of memory cells at WL3 in NS-SB1, the subset of memory cells can include M23 and M23. In the set of memory cells at WL3 in NS-SB2, the subset of memory cells can include M43 and M53. In the set of memory cells at WL3 in NS-SB3, the subset of memory cells can include M63 and M73. Similarly, in the set of memory cells at WL2 in NS-SB0, the subset of memory cells can include M02 and M12, and so forth.

Or, the count can be stored external to the memory array 126, such as in the data register 113. Or, the count can be stored external to the memory die 108. The data register or the memory cells which store the loop count are storage locations. An advantage to storing the loop count in the nonvolatile memory cells of the memory array is that the loop count will not be lost if there is a power outage in the memory device or if the loop count is overwritten when programming another block. In contrast, a data register typically uses a volatile memory such as RAM in which data can be lost in a power outage. Another advantage to storing the loop count in the nonvolatile memory cells is that it is less expensive than RAM.

The count can be a number such as one, two, three . . . , which identifies a number of program loops used to program the fastest memory cells an initial amount. A reference program voltage (Vpgm_ref) is a level of Vpgm when the programming of the fastest memory cells has been programmed the initial amount. Vpgm_initial can be derived from Vpgm_ref. The data which is stored can therefor represent the count of program loops, Vpgm_ref or Vpgm_initial.

At step 504, a command to program additional data is received. Step 505 retrieves the count of program loops. For example, this can be done as part of an internal data load, which is done as a part of an upper page program sequence, right at the start of the sequence. At step 506, Vpgm_initial is set based on the count of program loops (LC). This is a respective starting voltage for a remaining set of memory cells. One approach, at step 508, is to set Vpgm_initial=Vpgm_ref−(VvINT−VvA). For example, assume VvINT=1.0 V, VvA=0.5 V and Vpgm_ref=17 V. Then, Vpgm_initial=17−(1.0−0.5)=16.5 V. Another approach, at step 509, is to set Vpgm_initial=(Vpgm_low+LC×dVpgm_high)−(VvINT−VvA). For example, assume Vpgm_low=14 V, LC=3, dVpgm_high=1.0 V, VvINT=1.0 V and VvA=0.5 V. Then, Vpgm_initial=(14+3×1.0)−(1.0−0.5)= 16.5 V. Optionally, in a conservative approach, a further offset, such as 0.5-1.0 V can be applied to further reduce Vpgm_initial. This ensures that the first program pulse at the level of Vpgm_initial does not result in over-programming of the remaining set of memory cells.

The state machine can store data which identifies Vpgm_low, dVpgm_high, VvA and VvINT. In one approach, the state machine reads the value Vpgm_ref from the memory cells or the data register and performs the calculation of step 508. In another approach, the state machine read the value LC from the memory cells or the data register and performs the calculation of step 509.

dVpgm_high is a relatively high step size which can be used in programming a lower page of data, where reduced accuracy is acceptable as a tradeoff for faster programming. A relatively low step size, dVpgm_low, can be used in programming an upper page of data, where increased accuracy is more important.

Step 507 programs remaining sets of memory cells at the word line layer using the initial Vpgm. Efficiencies are achieved because Vpgm_initial is determined once from the initial set of memory cells and used multiple times—once for each of the remaining sets of memory cells. The time used in the lower page programming may be increased slightly due to the use of a relatively low initial Vpgm, Vpgm_low. However, the time used in programming each of the remaining sets of memory cells is minimized because Vpgm_initial is customized to the programming speed of the remaining sets of memory cells, which is considered to be the same as the programming speed of the initial set of memory cells. That is, Vpgm_initial can be set to the highest possible level which avoids over-programming while minimizing the number of program loops and therefore minimizing programming time.

Another, less efficient, approach is to determine Vpgm_initial separately during lower page programming of each set of memory cells, and to use Vpgm_initial for the upper page programming of each set of memory cells. However, this is not possible when single-pass programming is used. The approach of FIG. 5A is especially advantageous since single-pass programming is expected to be commonly used with 3D stacked non-volatile memory devices.

FIG. 5B depicts an example process for carrying out the programming operation of FIG. 5A when programming lower and upper pages of data. In this approach, step 510 programs a lower page of data to the initial set of memory cells in a first programming pass. These are selected memory cells. See FIGS. 8A and 8B. Step 511 programs an upper page of data to the initial set of memory cells in a second programming pass. See FIG. 8C. Step 512 programs lower and upper pages of data (e.g., multiple pages of data) to remaining sets of memory cells in a single programming pass. See FIGS. 7A and 7B.

Figure 5C:
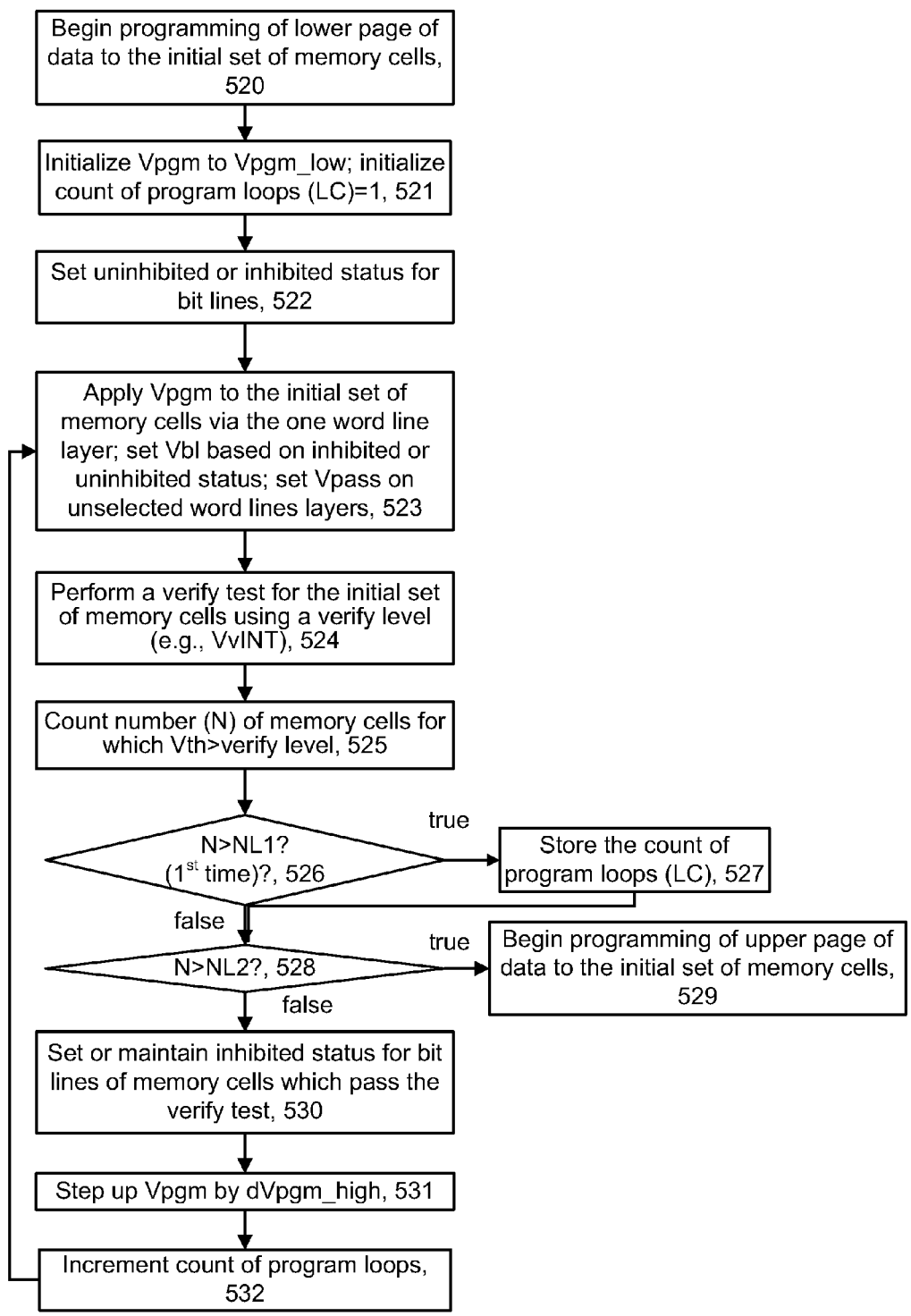
FIG. 5C depicts an example process in accordance with step 510 of FIG. 5B, in which a lower page of data is programmed to an initial set of memory cells and a program loop count is determined, in a first programming pass.

FIG. 5C depicts an example process in accordance with step 510 of FIG. 5B, in which a lower page of data is programmed to an initial set of memory cells and a program loop count is determined, in a first programming pass. Step 520 begins programming of a lower page of data to the initial set of memory cells. Step 521 initializes Vpgm to a relatively low level, Vpgm_low. This step also initializes a count of program loops=1. Vpgm_low can be low enough so that, when the initial amount of programming is completed, the memory cells are mostly already in a steady state, where the Vth of the memory cells increases consistently and predictably with the increase in Vpgm. For instance, Vpgm_low may be low enough so that two or three program loops are used to complete the initial amount of programming, even for a memory device with many program-erase cycles. Step 522 sets an uninhibited or inhibited status for the bit lines. For example, a bit line associated with a NAND string in which a memory cell is to remain in an erased state will have an inhibited status. A bit line associated with a NAND string in which a memory cell is to be programmed to a higher data state will have an uninhibited status, until the memory cell reaches the higher data state, at which time the status is changed to inhibited.

Step 523 applies Vpgm to the initial set of memory cells via the one word line layer, while setting Vb1 based on the inhibited or uninhibited status of each bit line, and setting Vpass on unselected word lines layers. Step 524 performs a verify test for the initial set of memory cells using a verify level (e.g., VvINT). It is efficient to use the verify level of a target data state (e.g., INT) to determine the initial amount of programming since an extra verify operation is avoided. However, it is possible to use a verify level to determine the initial amount of programming which is different than a verify level of a target data state.

Decision step 525 counts a number N of memory cells for which Vth exceeds the verify level. Decision step 526 determines if N>NL1 for the first time, where NL1 is a specified number of memory cells. If decision step 526 is true, step 527 stores the current value of the count of program loops (LC) and step 529 follows. If decision step 526 is false, decision step 528 determines if N>NL2, where NL2 is a specified number and NL2>NL1. For example, NL1 can represent a small fraction (e.g., 5%) of all memory cells being programmed, and NL2 can represent a large fraction (e.g., 95%) of all memory cells being programmed.

If decision step 528 is true, the programming of the lower page of data to the initial set of memory cells is completed, and step 529 begins programming of an upper page of data to the initial set of memory cells. See FIG. 5D. If decision step 528 is false, step 530 sets or maintains an inhibited status for bit lines of memory cells which pass the verify test. Step 531 steps up Vpgm by dVpgm_high, step 532 increments the count of program loops and a next program pulse is applied at step 523.

Generally, in a programming pass, the number of program loops can be limited to a maximum allowable number.

Figure 5D:
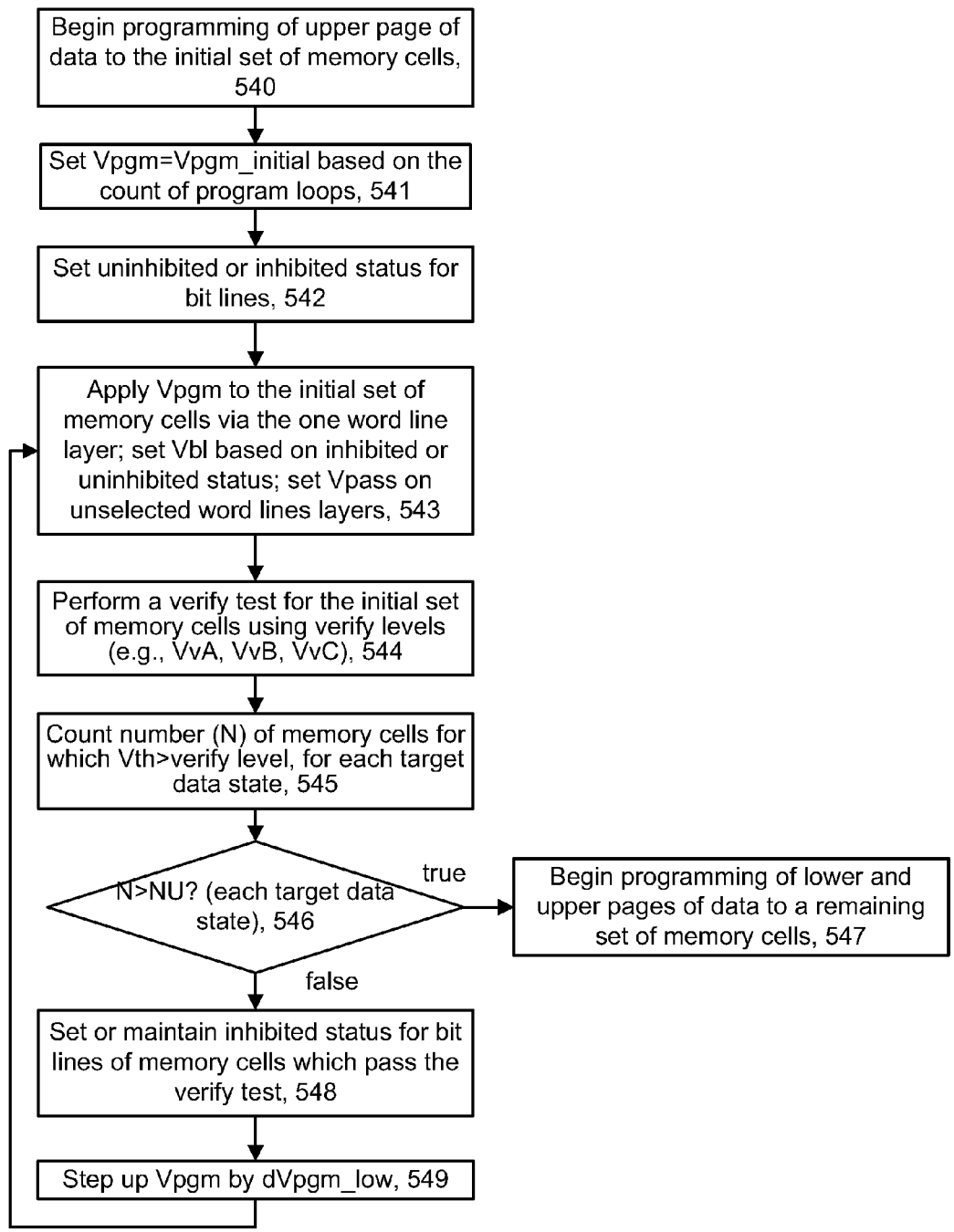
FIG. 5D depicts an example process in accordance with step 529 of FIG. 5C, in which an upper page of data is programmed to the initial set of memory cells using an initial Vpgm which is based on the program loop count, in a second programming pass.

FIG. 5D depicts an example process in accordance with step 529 of FIG. 5C, in which an upper page of data is programmed to the initial set of memory cells using an initial Vpgm which is based on the program loop count, in a second programming pass. In this case, the programming of the upper page of data is optimized based on results from programming the lower page of data.

When the host issues a write command and sends upper page bits to the memory device, the control circuitry of the memory can read the lower page bit which has just been programmed into each memory cell and store the bits in latches associated with the bit lines. The upper page bit is sent to additional latches associated with the bit lines. At this time, the target data state of each memory cell can be determined from the combination of the lower page bit and the upper page bit in the latches. Further, in response to the write command for the upper page, the control circuitry can read the loop count data and determine Vpgm_initial. At this point, the programming of the upper page can begin.

Step 540 begins programming of the upper page of data to the initial set of memory cells. Step 541 sets Vpgm=Vpgm_initial based on the count of program loops, such as discussed in connection with steps 508 and 509 of FIG. 5A. Step 542 set an uninhibited or inhibited status for the bit lines. Step 543 applies Vpgm to the initial set of memory cells via the one word line layer, sets Vb1 based on the inhibited or uninhibited status, and sets Vpass on the unselected word lines layers. Step 544 performs a verify test for the initial set of memory cells using verify levels (e.g., VvA, VvB, VvC in FIG. 7B). The verify test can use one or more verify levels for each target data state. One approach uses lower and higher verify levels for each target data state.

Step 545 counts a number (N) of memory cells for which Vth>verify level, for each target data state. Decision step 546 determines if N>NU for each target data state. If decision step 546 is true, step 547 begins programming of lower and upper pages of data to a remaining set of memory cells. See FIG. 5E. If decision step 546 is false, step 548 sets or maintains an inhibited status for bit lines of the memory cells which pass the verify test. Step 549 steps up Vpgm by dVpgm_low, and a next program pulse is applied at step 543.

Figure 5E:
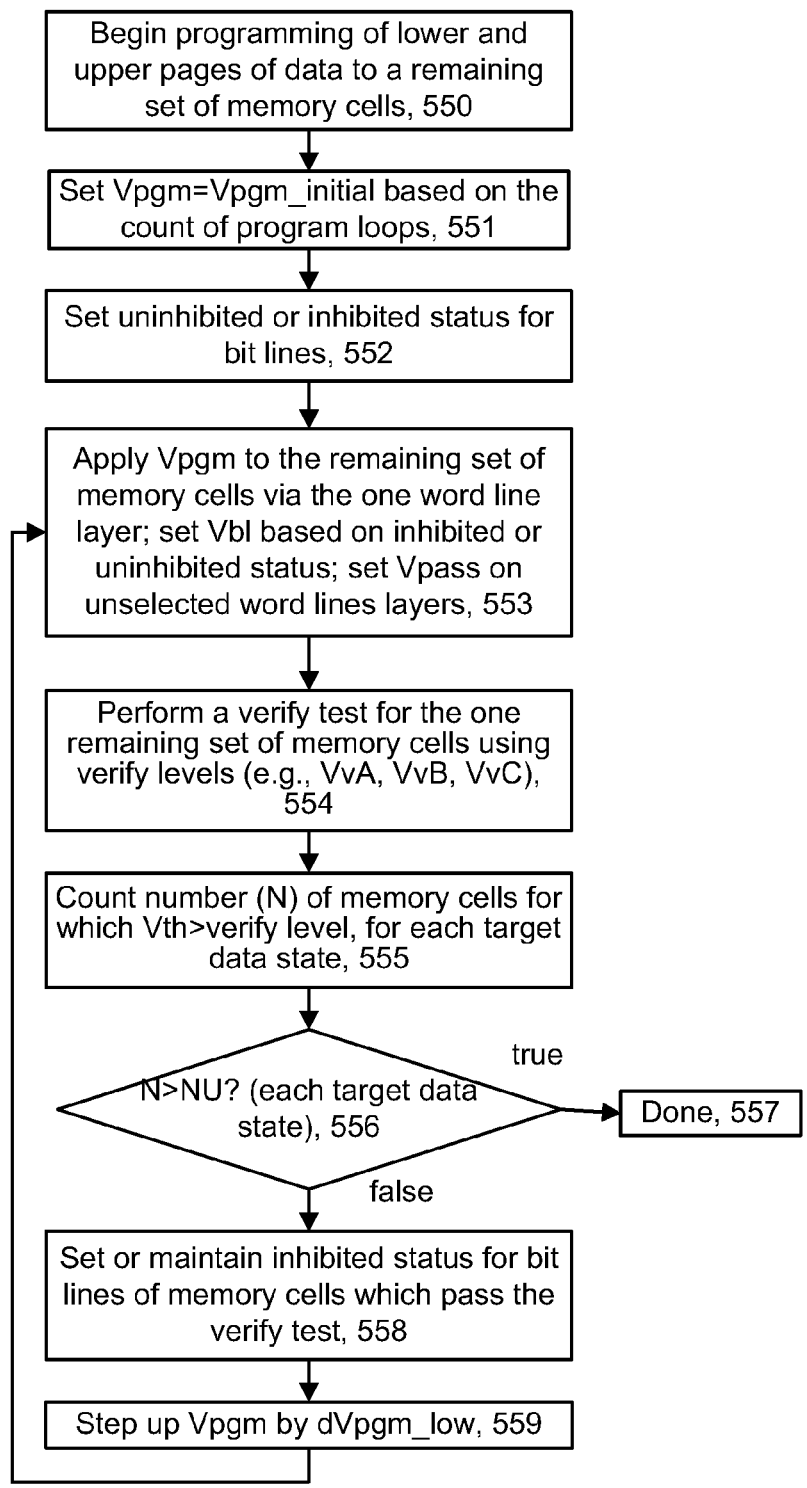
FIG. 5E depicts an example process in accordance with step 512 of FIG. 5B, in which lower and upper pages of data are programmed to a remaining set of memory cells using an initial Vpgm which is based on the program loop count, in a single programming pass.

FIG. 5E depicts an example process in accordance with step 512 of FIG. 5B, in which lower and upper pages of data are programmed to a remaining set of memory cells using an initial Vpgm which is based on the program loop count, in a single programming pass. Step 550 begins programming of lower and upper pages of data to a remaining set of memory cells. In general, there will be many remaining sets of selected memory cells after the initial set of memory cells is programmed. Step 551 sets Vpgm=Vpgm_initial based on the count of program loops. Step 552 set an uninhibited or inhibited status for the bit lines. Step 553 applies Vpgm to the initial set of selected memory cells via the one word line layer, sets Vb1 based on the inhibited or uninhibited status, and sets Vpass on the unselected word lines layers. Step 554 performs a verify test for the remaining set of memory cells using verify levels (e.g., VvA, VvB, VvC in FIG. 7B).

Step 555 counts a number (N) of memory cells for which Vth>verify level, for each target data state. Decision step 556 determines if N>NU for each target data state. If decision step 556 is true, the programming is done at step 557. If decision step 556 is false, step 558 sets or maintains an inhibited status for bit lines of the memory cells which pass the verify test. Step 559 steps up Vpgm by dVpgm_low, and a next program pulse is applied at step 553.

Figure 6A:
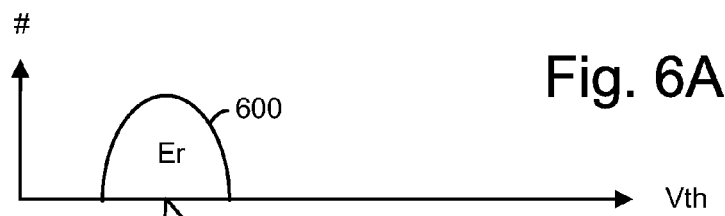
FIGS. 6A and 6B depict single level cell (SLC) programming, in which two data states are used.
Figure 6B:
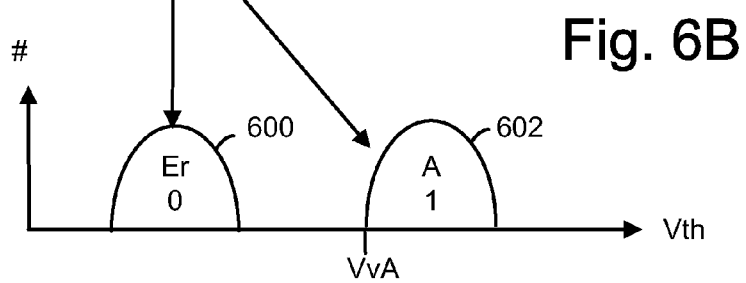

FIGS. 6A and 6B depict single level cell (SLC) programming, in which two data states are used. In SLC programming, two data states are used. For instance "0" is the erased (Er) state and "1" is the A state. The memory cells are initially in the Er state with Vth distribution 600. Some of the memory cells are then programmed to the A state with Vth distribution 602 in a single programming pass. During the programming, a verify level VvA can be used to detect an initial amount of programming for an initial set of memory cells on one word line layer, as well as to detect the completion of programming to the A state. Or, a verify level which is below VvA and above the Er state can be used to detect the initial amount of programming. Based on the count of program loops used to perform the initial amount of programming, an optimal Vpgm_initial can be used in programming remaining sets of memory cells on the one word line layer.

Figure 7A:
FIGS. 7A and 7B depict a one-pass programming operation in which four data states are used.
Figure 7B:
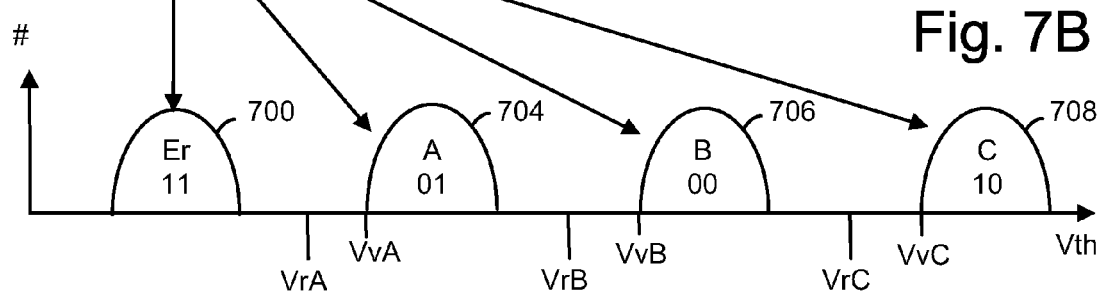

FIGS. 7A and 7B depict a one-pass programming operation in which four data states are used. One-pass programming, also referred to as full sequence programming, involves a series of multiple program-verify operations which are performed starting from an initial Vpgm level and continuing until the threshold voltages of a set of selected memory cells reach one or more respective verify levels of respective target data states. In one-pass programming, all memory cells are initially in an erased state. Some of the memory cells are not programmed and remain in the erased state while others are programmed to higher target data states.

Example Vth distributions for the memory cell array are provided for a case where each memory cell stores two bits of data. Each graph depicts Vth on the horizontal axis and a number or population of memory cells in a Vth distribution on the vertical axis. One bit represents the lower page (LP) data and the other bit represents the upper page (UP) data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 700 is provided for erased (Er) state memory cells. Three Vth distributions 704, 706 and 708 represent target data states A, B and C, respectively, which are reached by memory cells when their Vth exceeds a verify level of VvA, VvB or VvC, respectively.

Optionally, lower and upper verify levels can be used for each target data state such that the memory cells enter a slow programming mode or zone (e.g., by raising the associated bit line voltages applied during program) when their Vth is between the lower verify level and the higher verify level of a respective target data state.

Read reference voltages VrA, VrB and VrC which are between the Vth distributions are used for reading data from the memory cells. By testing whether the Vth of a given memory cell is above or below one or more of the read reference voltages, the system can determine the data state which is represented by a memory cell.

FIGS. 8A to 8C depict a two-pass programming operation, in which four data states are used. Each pass can be used to program a page of data. For example, programming of lower and upper pages in two-bit, four-level memory cells is provided. Programming can be performed one logical page at a time, with the lower page followed by the upper page. Initially, all memory cells are in the Er state, represented by the distribution 800 in FIG. 8A.

FIG. 8B depicts programming of a lower page of data in a first programming pass. If the lower page has a bit=1, the associated memory cell remains in the distribution 800 and the data is represented by x1, where x is an upper page bit that is not yet known. If the lower page has a bit=0, the memory cell is programmed to a higher Vth as represented by a distribution 502, which is an interim distribution (INT), using a verify level VvINT. The data of these memory cells is represented by x0. As mentioned, a relatively high Vpgm_step size, dVpgm_high, can be used in this programming pass to increase the programming speed. As a result, the Vth distribution width for the INT state is relatively wide. However, this is acceptable because the INT distribution does not represent a final data state.

FIG. 8C depicts programming of an upper page of data in a second programming pass. If UP/LP=11, the associated memory cell in the distribution 800 remains in the distribution 800 and stores data bits 11. If UP/LP=01, the memory cells in the distribution 800 are programmed to the distribution 804 (state A) using VvA. If UP/LP=10, the memory cells in the distribution 802 are programmed to the distribution 808 (state C) using VvC. If UP/LP=00, the memory cells in the distribution 802 are programmed to the distribution 806 (state B) using VvB. Programming can be similarly extended to three or more bits per memory cell, using eight or more data states.

In this example, a count of program loops is made in a first pass of a two-pass programming operation for an initial set of memory cells to provide a Vpgm_initial for a second pass of the two-pass programming operation for the initial set of memory cells, and for a one-pass programming operation for a remaining set of memory cells. An option is to obtain a count of program loops in the second pass of the two-pass programming operation, and to uses this to provide a Vpgm_initial for the one-pass programming operation for a remaining set of memory cells. In this case, the initial amount of programming can be detected using VvA, for instance.

FIG. 8D depicts a process for determining a count of program loops needed to program the fastest memory cells in an initial set of memory cells an initial amount, in accordance with step 502 of FIG. 5A and with the transition from FIG. 8A to 8B. The Vth distribution 800 is the initial distribution of all memory cells after an erase operation. The Vth distributions 810, 811, 812, 813 and 802 occur after one, two, three, four and five program-verify iterations (loops), respectively. In the Vth distribution 812, a portion 814 of the distribution exceeds VvINT. This can represent the completion of an initial amount of programming. For example, this can represents the case where N>NL1 in decision step 526 of FIG. 5C. The programming pass is completed when the Vth distribution 802 is reached after the fifth program-verify iteration.

Figure 9A:
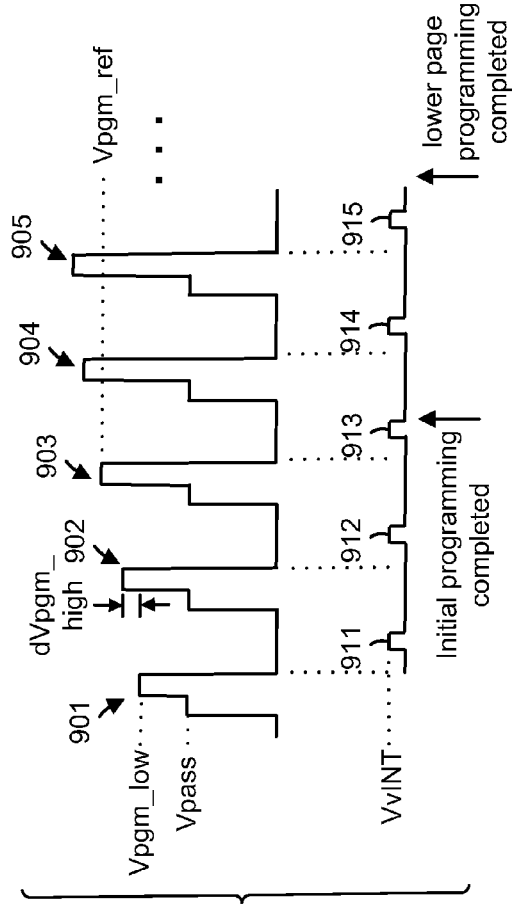
FIG. 9A depicts program and verify voltages for programming a lower page of data in an initial set of memory cells in accordance with FIG. 5C, where a relatively low initial Vpgm, Vpgm_low, and a relatively high Vpgm step size, dVpgm_high, are used.

FIG. 9A depicts program and verify voltages for programming a lower page of data in an initial set of memory cells in accordance with FIG. 5C, where a relatively low initial Vpgm, Vpgm_low, and a relatively high Vpgm step size, dVpgm_high, are used. A programming operation may include multiple program-verify iterations, where each program-verify iteration includes a programming portion comprising a program pulse and a following verify operation comprising one or more verify voltages. The program pulse and verify voltages can be applied to a selected word line layer portion, for instance.

In one approach, the program pulses are stepped up in successive iterations. Moreover, each program pulse may include a first portion which has a pass voltage (Vpass) level, e.g., 6-8 V, followed by a second, peak amplitude portion at a program level, e.g., 12-25V. For example, this programming pass includes program pulses 901-905 and associated verify pulses 911-915, respectively. In this example, the initial amount of programming is completed after the verify pulse 913 in the third program loop, so that the loop count=3. A program voltage of Vpgm_ref is applied in the third program loop. The lower page programming is completed after the verify pulse 915 in the fifth program loop.

Figure 9B:
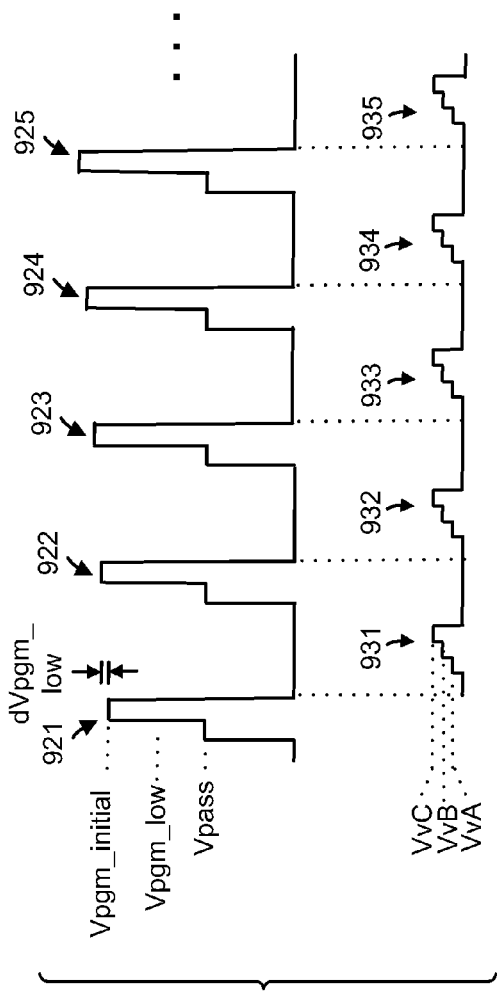
FIG. 9B depicts program and verify voltages for programming an upper page of data in a second programming pass in accordance with FIG. 5D, or for programming lower and upper pages of data concurrently in a single programming pass in accordance with FIG. 5E, where an initial Vpgm, Vpgm_initial, is based on a program loop count and a relatively low Vpgm step size, dVpgm_low, is used.

FIG. 9B depicts program and verify voltages for programming an upper page of data in a second programming pass in accordance with FIG. 5D, or for programming lower and upper pages of data concurrently in a single programming pass in accordance with FIG. 5E, where an initial Vpgm, Vpgm_initial, is based on a program loop count and a relatively low Vpgm step size, dVpgm_low, is used. For example, this programming pass includes program pulses 921-925 and associated verify voltages 931-935, respectively. Each verify voltage comprises three levels: VvA, VvB and VvC. In this example, several program loops are used and the completion of the programming is not shown. Note that the step size can vary in a programming pass.

Figure 10A:
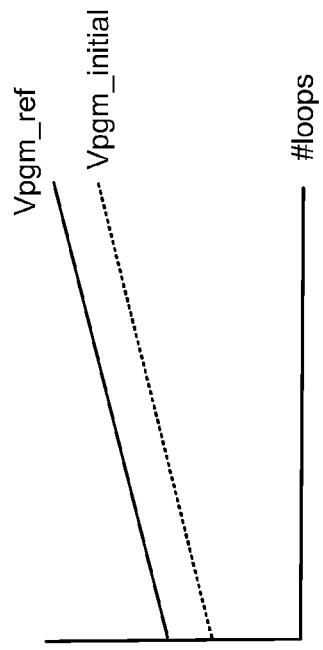
FIG. 10A depicts a variation in a memory hole diameter (Dmh) in a stack of word line layers.

FIG. 10A depicts a variation in Dmh in a stack of word line layers. The x-axis represents a distance in a stack ranging from a bottom word line to a top word line. As mentioned, the diameter tends to decrease toward the bottom of the stack. Dmh ranges from a minimum diameter to a maximum diameter. Dmh is expected to vary consistently among different memory holes in the memory device. As explained in connection with FIGS. 3A and 3B, Dcore is a diameter of the core region of a memory hole and tends to vary with Dmh, and Wono+ch is the sum of the widths of an ONO region and a channel region. Wono+ch tends to be uniform in a memory hole since these materials are deposited on sidewalls of the memory hole.

Figure 10B:
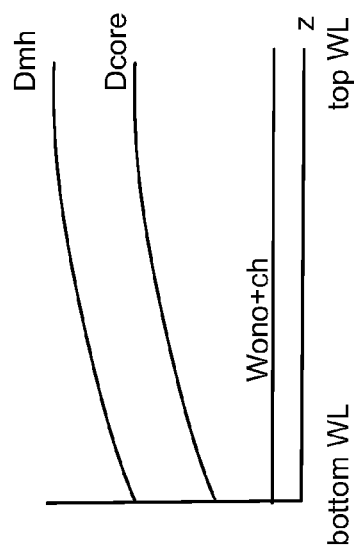
FIG. 10B depicts Vpgm_ref and Vpgm_initial as a function of a number of program loops needed to perform an initial amount of programming.

FIG. 10B depicts Vpgm_ref and Vpgm_initial as a function of a number of program loops needed to perform an initial amount of programming. A higher number of program loops is associated with memory cells which have a slower programming speed. These are memory cells at relatively wider portions of a memory hole, and memory cells which have experienced a relatively small number of program-erase cycles. A lower number of program loops is associated with memory cells which have a faster programming speed. These are memory cells at relatively narrower portions of a memory hole (FIG. 10C), and memory cells which have experienced a relatively large number of program-erase cycles (FIG. 10D). In this example, there is a fixed offset between Vpgm_ref and Vpgm_initial. Further, Vpgm_ref>Vpgm_initial The offset is a function of the verify level (e.g., VvINT) which is used to determine the initial amount of programming and the verify level (e.g., VvA) of the lowest target data state which is used when starting a program pass from Vpgm_initial. If VvINT>VvA, the amount of programming used to cause the Vth of the memory cells to reach VvINT is more programming than is needed to cause the Vth of the memory cells to reach VvA. Thus, Vpgm_initial should be less than Vpgm_ref by an offset, as shown. If VvINT<VvA, the amount of programming used to cause the Vth of the memory cells to reach VvINT is less programming than is needed to cause the Vth of the memory cells to reach VvA. Thus, Vpgm_initial should be more than Vpgm_ref.

In another approach, the offset can vary as a function of the loop count so that Vpgm_initial is a non-linear function of the loop count and Vpgm_ref.

Figure 10C:
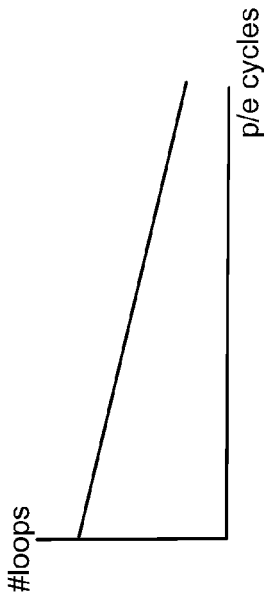
FIG. 10C depicts a number of program loops needed to perform an initial amount of programming as a function of Dmh.
Figure 10D:
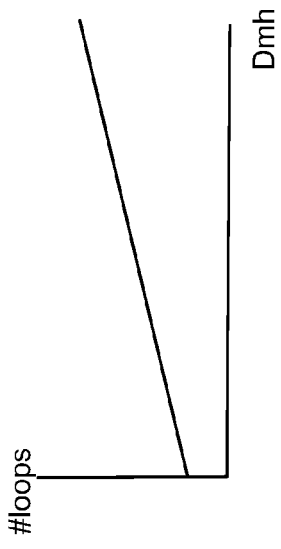
FIG. 10D depicts a number of program loops needed to perform an initial amount of programming as a function of program-erase (p/e) cycles.

FIG. 10C depicts a number of program loops needed to perform an initial amount of programming as a function of Dmh.

FIG. 10D depicts a number of program loops needed to perform an initial amount of programming as a function of program-erase (p/e) cycles.

In one embodiment, a method for programming in a 3D stacked non-volatile memory device comprises: programming an initial set of memory cells using a respective starting program voltage, each memory cell of the initial set of memory cells is in a respective NAND string of an initial set of NAND strings; determining a count of program loops used in the programming of the initial set of memory cells; and programming a remaining set of memory cells using a respective starting program voltage which is determined based on the count, each memory cell of the remaining set of memory cells is in a respective NAND string of a remaining set of NAND strings, the initial set of memory cells and the remaining set of memory cells are arranged along respective memory holes at a common word line layer in the 3D stacked non-volatile memory device.

In another embodiment, a 3D stacked non-volatile memory device comprises: an initial set of memory cells, each memory cell of the initial set of memory cells is in a respective NAND string of an initial set of NAND strings; a remaining set of memory cells, each memory cell of the remaining set of memory cells is in a respective NAND string of a remaining set of NAND strings, the initial set of memory cells and the remaining set of memory cells are arranged along respective memory holes at a common word line layer in the 3D stacked non-volatile memory device; and a control circuit. The control circuit: programs the initial set of memory cells using a respective starting program voltage, determines a count of program loops used in the programming of the initial set of memory cells, and programs the remaining set of memory cells using a respective starting program voltage which is determined based on the count.

In another embodiment, a method for programming in a 3D stacked non-volatile memory device comprises: programming an initial set of memory cells, the initial set of memory cells is associated with one word line layer of a plurality of word line layers in a block of memory cells, and with one sub-block of a plurality of sub-blocks of the block of memory cells, each of the plurality of sub-blocks comprises a different respective set of U-shaped NAND strings; determining a count of program loops used in the programming of the initial set of memory cells; and determining a starting program voltage based on the count for programming a plurality of other sets of memory cells associated with the one word line layer, the plurality of other sets of memory cells are associated with a plurality of other sub-blocks of the plurality of sub-blocks.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming in a 3D stacked non-volatile memory device, comprising:
    programming an initial set of memory cells using a respective starting program voltage, each memory cell of the initial set of memory cells is in a respective NAND string of an initial set of NAND strings;
    determining a count of program loops used in the programming of the initial set of memory cells; and
    programming a remaining set of memory cells using a respective starting program voltage which is determined based on the count, each memory cell of the remaining set of memory cells is in a respective NAND string of a remaining set of NAND strings, the initial set of memory cells and the remaining set of memory cells are arranged along respective memory holes at a common word line layer in the 3D stacked non-volatile memory device, wherein:
    the count of program loops is a minimum number of program loops needed to cause threshold voltages of at least a specified number of memory cells of the initial set of memory cells to exceed a verify level for programming a lower page of data in a multi-pass programming operation; and
    the respective starting program voltage which is determined based on the count is for programming operation.

2. The method of claim 1, wherein:
    the respective memory holes have diameters which vary as a function of word line layer in the 3D stacked non-volatile memory device.

3. The method of claim 1, wherein:
    a programming speed of the initial set of memory cells and the remaining set of memory cells is a function of the word line layer.

4. The method of claim 1, wherein:
each NAND string in the initial set of NAND strings is U-shaped and comprises a source side and a drain side;
each NAND string in the remaining set of NAND strings is U-shaped and comprises a source side and a drain side; and
the initial set of memory cells is in the source side of the initial set of NAND strings and the remaining set of memory cells is in the source side of the remaining set of NAND strings, or the initial set of memory cells is in the drain side of the initial set of NAND strings and the remaining set of memory cells is in the drain side of the remaining set of NAND strings.

5. The method of claim 1, wherein:
each NAND string in the initial set of NAND strings is U-shaped and comprises a source side and a drain side;
each NAND string in the remaining set of NAND strings is U-shaped and comprises a source side and a drain side; and
the initial set of memory cells is in the source side of the initial set of NAND strings and the remaining set of memory cells is in the drain side of the remaining set of NAND strings, or the initial set of memory cells is in the drain side of the initial set of NAND strings and the remaining set of memory cells is in the source side of the remaining set of NAND strings.

6. The method of claim 1, wherein:
each NAND string in the initial set of NAND strings is straight; and
each NAND string in the remaining set of NAND strings is straight.

7. The method of claim 1, further comprising:
programming another remaining set of memory cells using the respective starting program voltage which is determined based on the count, each memory cell of the another remaining set of memory cells is in one of the respective NAND strings of the initial set of NAND strings, and is arranged along the respective memory holes of the initial set of memory cells, above or below, and adjacent to, the initial set of memory cells.

8. The method of claim 1, further comprising:
storing data indicating the count in a storage location, the storage location comprising at least one of the initial set of memory cells or a data register; and
retrieving the data indicating the count from the storage location in connection with the programming of the remaining set of memory cells.

9. The method of claim 1, wherein:
the initial set of NAND strings and the remaining set of NAND strings are in a block of the 3D stacked non-volatile memory device; and
the method further comprises programming another remaining set of memory cells in the block at the common word line layer in the 3D stacked non-volatile memory device using the respective starting program voltage which is determined based on the count.

10. A 3D stacked non-volatile memory device, comprising:
an initial set of memory cells, each memory cell of the initial set of memory cells is in a respective NAND string of an initial set of NAND strings;
a remaining set of memory cells, each memory cell of the remaining set of memory cells is in a respective NAND string of a remaining set of NAND strings, the initial set of memory cells and the remaining set of memory cells are arranged along respective memory holes at a common word line layer in the 3D stacked non-volatile memory device; and
a control circuit, the control circuit is configured to: program the initial set of memory cells using a respective starting program voltage, determine a count of program loops used in the programming of the initial set of memory cells, and program the remaining set of memory cells using a respective starting program voltage which is determined based on the count, wherein:
the count of program loops is a minimum number of program loops needed to cause threshold voltages of at least a specified number of memory cells of the initial set of memory cells to exceed a verify level for programming a lower page of data in a multi-pass programming operation; and
the respective starting program voltage which is determined based on the count is for programming multiple pages of data into the remaining set of memory cells in a one-pass programming operation.

11. The 3D stacked non-volatile memory device of claim 10, wherein:
each NAND string in the initial set of NAND strings comprises a drain select gate transistor, the drain select gate transistors of the initial set of NAND strings are connected to one another; and
each NAND string in the remaining set of NAND strings comprises a drain select gate transistor, the drain select gate transistors of the remaining set of NAND strings are connected to one another but not to the drain select gate transistors of the initial set of NAND strings.

12. The 3D stacked non-volatile memory device of claim 10, further comprising:
a plurality of alternating dielectric layers and word line layers, wherein control gates of the initial set of memory cells and the remaining set of memory cells are connected to one or more of the word line layers.

13. The 3D stacked non-volatile memory device of claim 10, wherein:
the respective memory holes have diameters which vary as a function of word line layer in the 3D stacked non-volatile memory device.

14. The 3D stacked non-volatile memory device of claim 10, wherein:
the initial set of NAND strings and the remaining set of NAND strings are in a block of the 3D stacked non-volatile memory device; and
the method further comprises programming another remaining set of memory cells in the block at the common word line layer in the 3D stacked non-volatile memory device using the respective starting program voltage which is determined based on the count.

15. A method for programming in a 3D stacked non-volatile memory device, comprising:
programming one page of data into an initial set of memory cells in one program pass of a multi-pass programming operation, the initial set of memory cells is associated with one word line layer of a plurality of word line layers in a block of memory cells, and with one sub-block of a plurality of sub-blocks of the block of memory cells, each sub-lock of the plurality of sub-blocks comprises a different respective set of NAND strings;
determining a count of program loops used in the programming of the one page of data into of the initial set of memory cells;
determining a starting program voltage based on the count for programming a plurality of other sets of memory cells associated with the one word line layer, the plurality of other sets of memory cells are associated with a plurality of other sub-blocks of the plurality of sub-blocks; and using the starting program voltage, programming multiple pages of data into each set of memory cells in the plurality of other sets of memory cells in a one-pass programming operation.

16. The method of claim 15, wherein:

the count of program loops is a minimum number of program loops needed to cause a threshold voltage of at least a specified number of memory cells in the initial set of memory cells to exceed a verify level.

17. The method of claim 16, wherein:

the one page of data comprises a lower page of data; and the verify level is a verify level for programming the lower page of data in the multi-pass programming operation.

18. The method of claim 1, further comprising:

programming the initial set of memory cells with an upper page of data using a respective starting program voltage which is determined based on the count.

19. The 3D stacked non-volatile memory device of claim 10, wherein:

the control circuit is configured to determine another starting program voltage based on the count and use the another starting program voltage to program another page of data into the initial set of memory cells in the multi-pass programming operation.

20. The method of claim 15, further comprising:

determining a starting program voltage based on the count for programming another page of data into the initial set of memory cells in another program of the multi-pass programming operation.

* * * * *

UNITED STATES PATENT AND TRADEMARK OFFICE
CERTIFICATE OF CORRECTION

| | |
|---|---|
| PATENT NO. | : 9,142,298 B2 |
| APPLICATION NO. | : 13/940504 |
| DATED | : September 22, 2015 |
| INVENTOR(S) | : Dong et al. |

Page 1 of 1

It is certified that error appears in the above-identified patent and that said Letters Patent is hereby corrected as shown below:

Claims

Claim 15, column 20, line 60: After "each" and before "of" delete "sub-lock" and replace with "sub-block".

Signed and Sealed this
Fifth Day of April, 2016

Michelle K. Lee
*Director of the United States Patent and Trademark Office*